United States Patent
Yokogawa

(10) Patent No.: US 11,843,018 B2
(45) Date of Patent: Dec. 12, 2023

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventor: Sozo Yokogawa, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 25 days.

(21) Appl. No.: 16/640,939

(22) PCT Filed: Jul. 13, 2018

(86) PCT No.: PCT/JP2018/026604
§ 371 (c)(1),
(2) Date: Feb. 21, 2020

(87) PCT Pub. No.: WO2019/044213
PCT Pub. Date: Mar. 7, 2019

(65) Prior Publication Data
US 2020/0227467 A1    Jul. 16, 2020

(30) Foreign Application Priority Data
Sep. 1, 2017 (JP) ................................ 2017-168260

(51) Int. Cl.
H01L 31/0236 (2006.01)
H01L 27/146 (2006.01)
G02B 1/11 (2015.01)

(52) U.S. Cl.
CPC .......... *H01L 27/14645* (2013.01); *G02B 1/11* (2013.01); *H01L 27/14612* (2013.01);
(Continued)

(58) Field of Classification Search
CPC .......... H01L 31/0236; H01L 31/02363; H01L 31/02366; H01L 31/0352; H01L 31/035281
See application file for complete search history.

(56) References Cited

U.S. PATENT DOCUMENTS

| | | |
|---|---|---|
| 2004/0227140 A1 | 11/2004 | Lee et al. |
| 2006/0113552 A1 | 6/2006 | Song et al. |

(Continued)

FOREIGN PATENT DOCUMENTS

| | | |
|---|---|---|
| JP | 2013-033864 | 2/2013 |
| JP | 2015-029054 | 2/2015 |

(Continued)

OTHER PUBLICATIONS

International Search Report and Written Opinion prepared by the European Patent Office dated Oct. 4, 2018, for International Application No. PCT/JP2018/026604.

(Continued)

*Primary Examiner* — Jae Lee
(74) *Attorney, Agent, or Firm* — Sheridan Ross PC

(57) ABSTRACT

An imaging device includes a first photoelectric conversion region (170) receiving light within a first range of wavelengths, a second photoelectric conversion region (170) receiving light within a second range of wavelengths, and a third photoelectric conversion region (170) receiving light within a third range of wavelengths. At least a portion of a light-receiving surface of the first photoelectric conversion region has a first concave-convex structure (113), and a light-receiving surface of the second photoelectric conversion region has a different structure (111) than the first concave-convex structure.

16 Claims, 25 Drawing Sheets

(52) U.S. Cl.
CPC .. *H01L 27/14621* (2013.01); *H01L 27/14625* (2013.01); *H01L 27/14623* (2013.01)

(56) References Cited

U.S. PATENT DOCUMENTS

| | | | |
|---|---|---|---|
| 2006/0115916 A1 | 6/2006 | Lee et al. | |
| 2006/0252171 A1 | 11/2006 | Lee et al. | |
| 2007/0145505 A1* | 6/2007 | Kim | H01L 27/14685 257/432 |
| 2008/0290440 A1* | 11/2008 | Lee | H01L 27/1462 257/436 |
| 2009/0242951 A1* | 10/2009 | Ueno | H01L 27/14605 257/292 |
| 2016/0112614 A1* | 4/2016 | Masuda | H04N 9/04 348/374 |
| 2017/0012164 A1* | 1/2017 | Masuko | H01L 31/1884 |
| 2018/0027157 A1 | 1/2018 | Masuda et al. | |
| 2018/0053811 A1* | 2/2018 | Wacyk | H10K 59/352 |

FOREIGN PATENT DOCUMENTS

| | | |
|---|---|---|
| JP | 2016015430 A | 1/2016 |
| TW | 200913238 A | 3/2009 |
| TW | 201137957 A | 11/2011 |
| WO | WO 2007/074977 | 7/2007 |

OTHER PUBLICATIONS

Yokogawa et al., "IR sensitivity enhancement of CMOS Image Sensor with diffractive light trapping pixels," Scientific Reports, vol. 7, No. 3832, dated Jan. 19, 2017, 9 pages.

* cited by examiner

[Fig. 1]
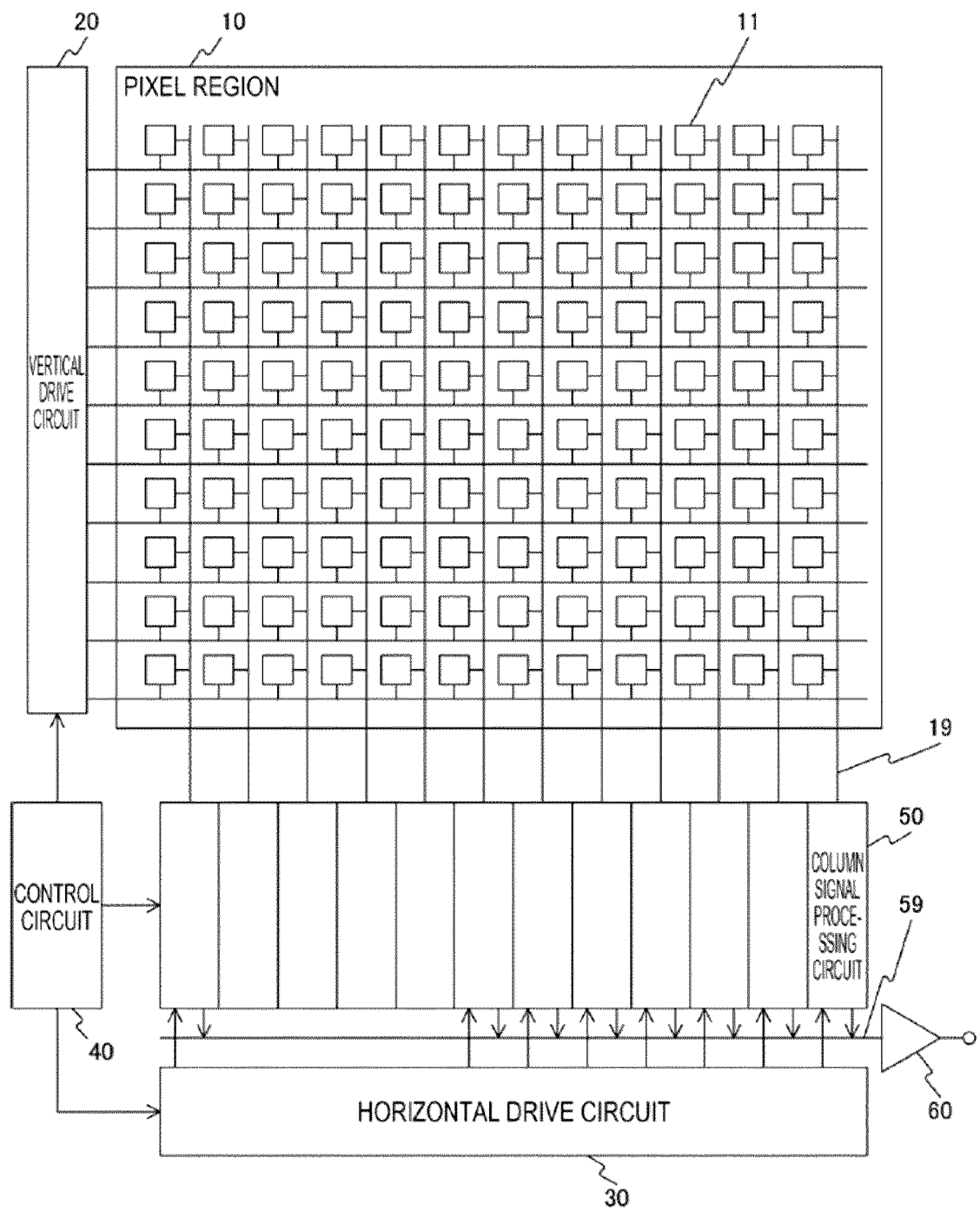

[Fig. 2]
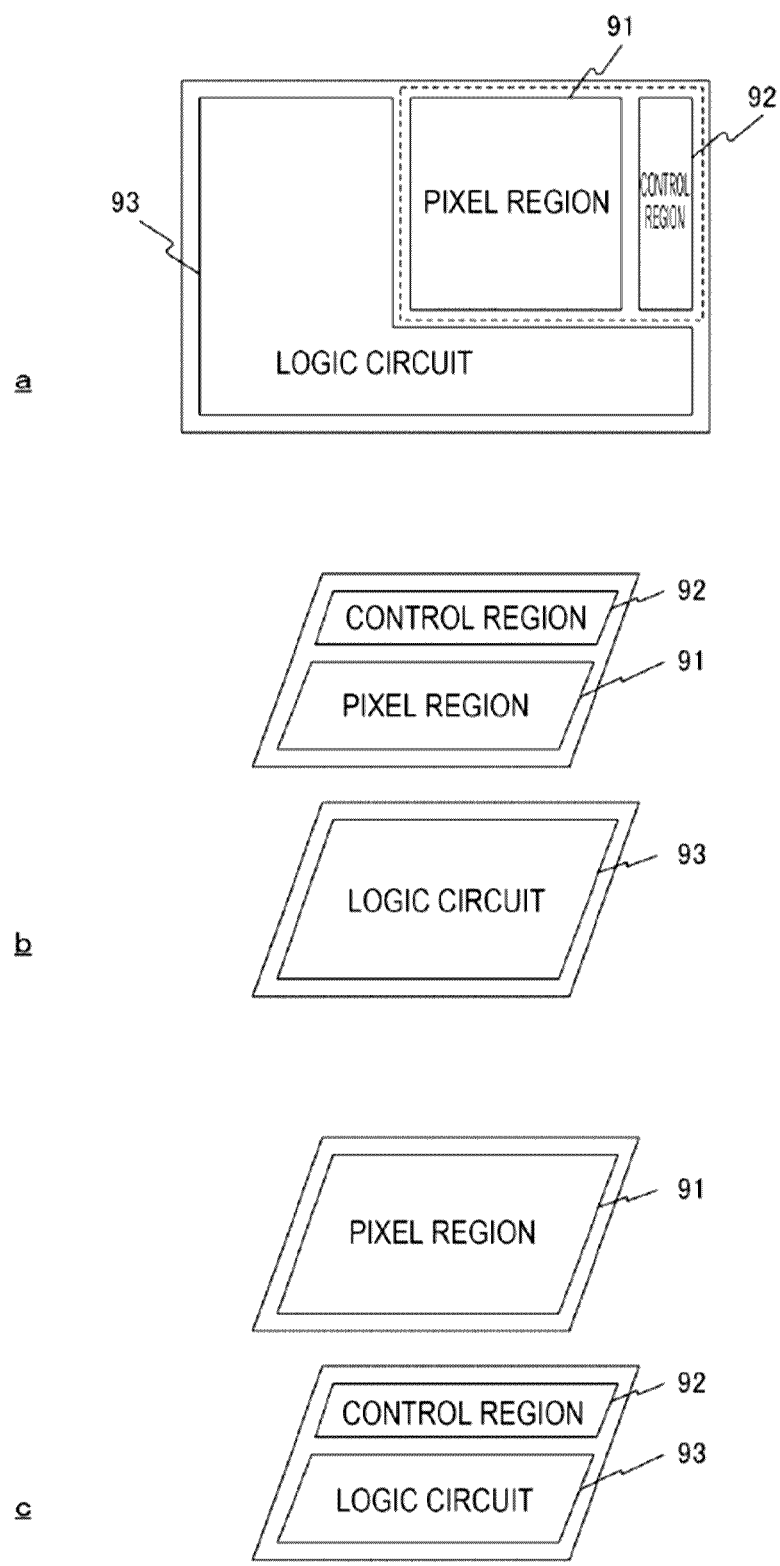

[Fig. 3]
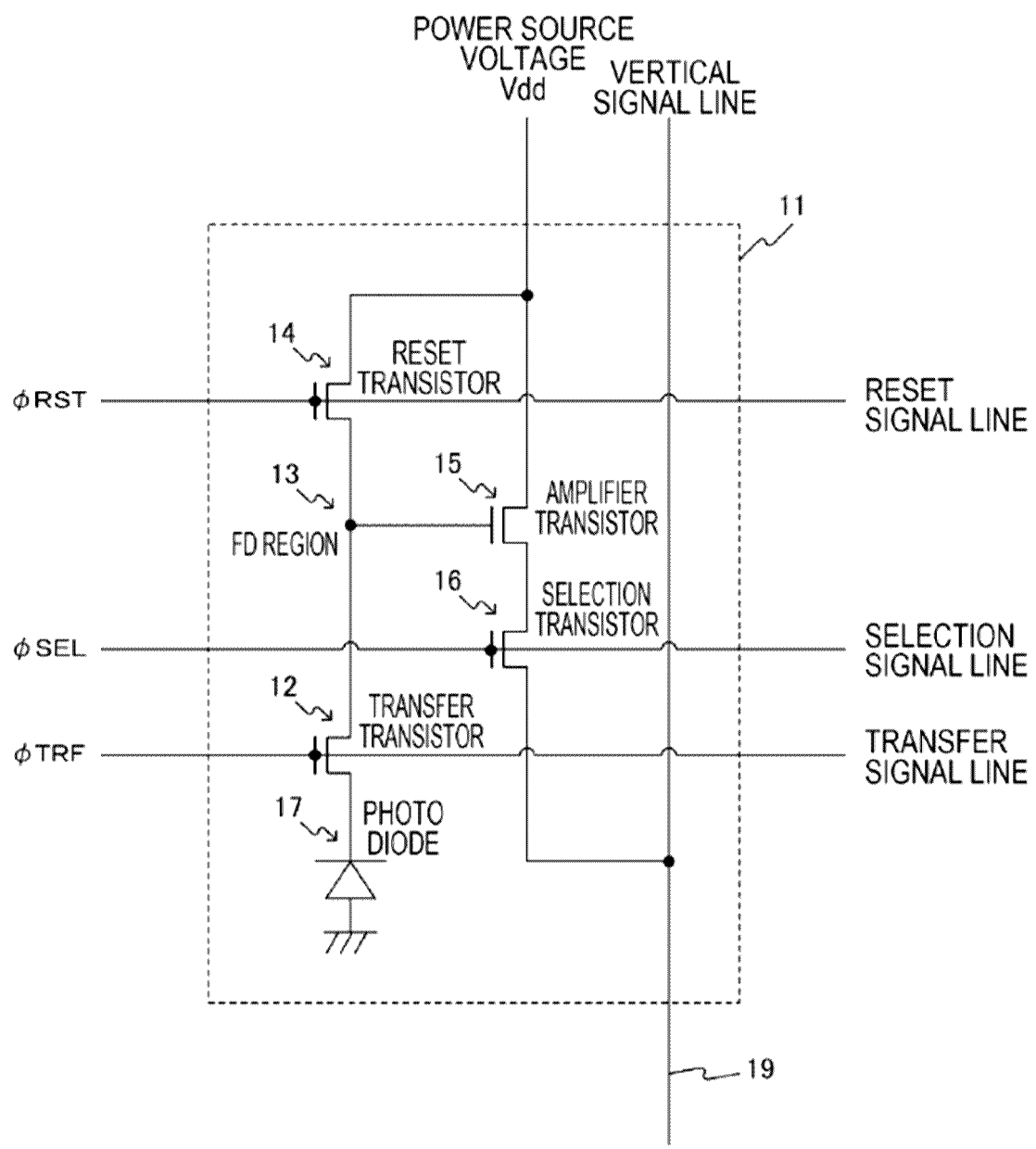

[Fig. 4]
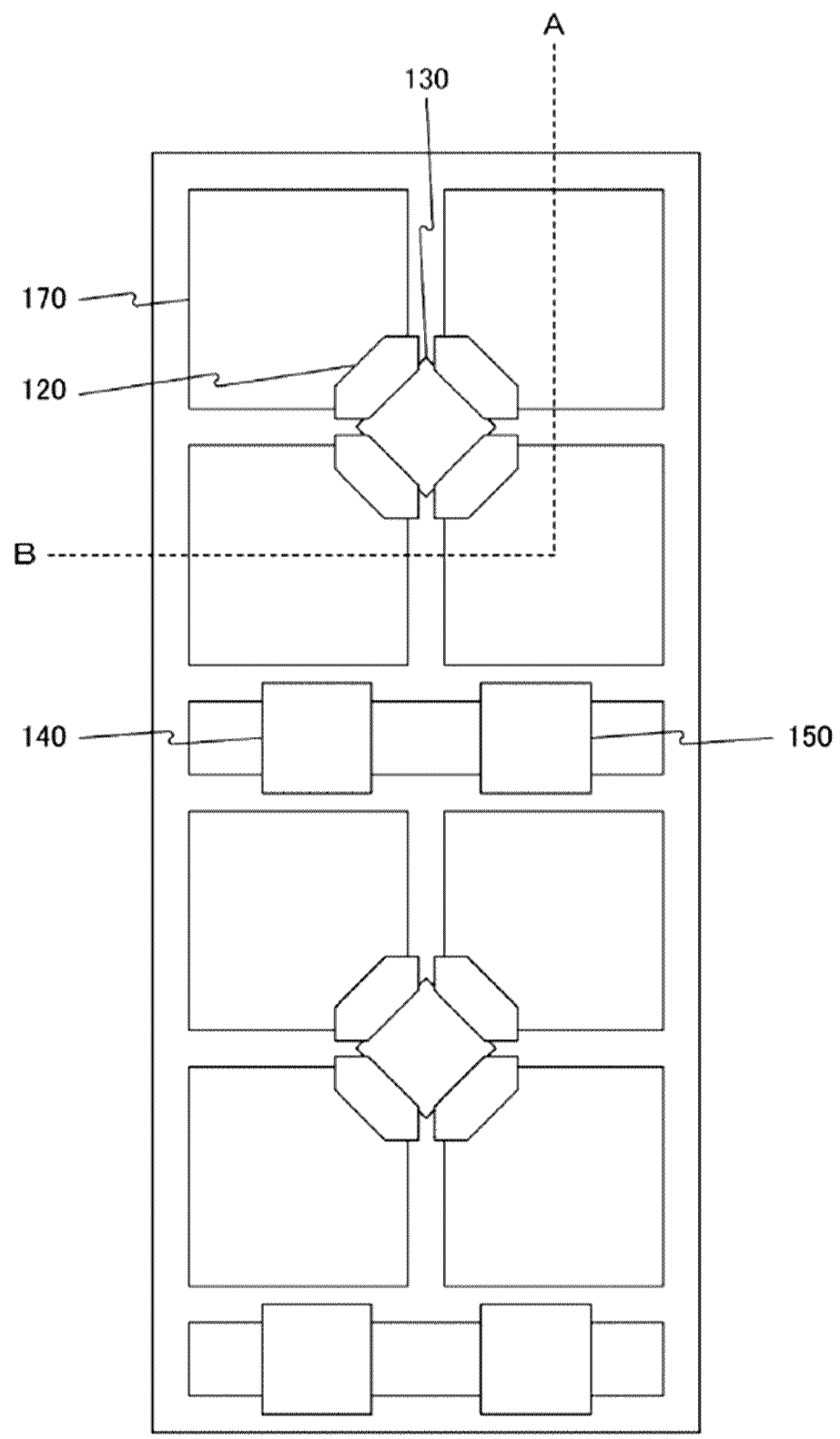

[Fig. 5]
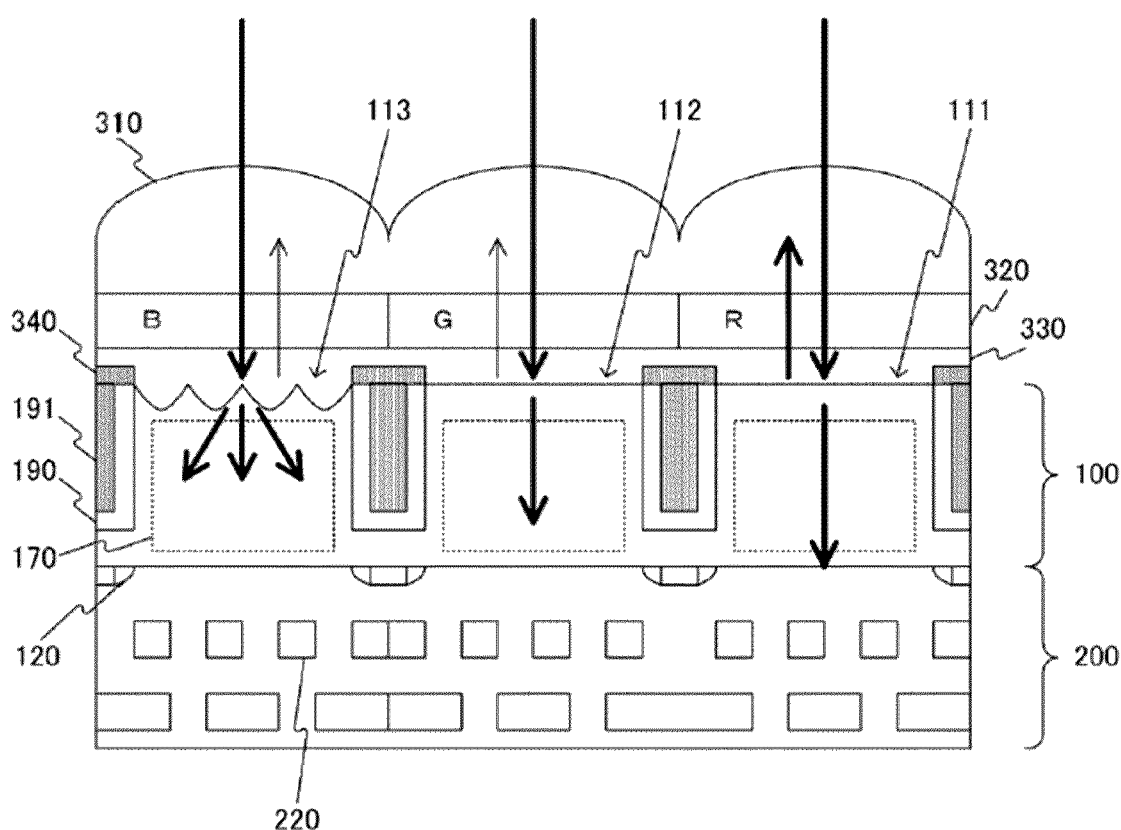

[Fig. 6]
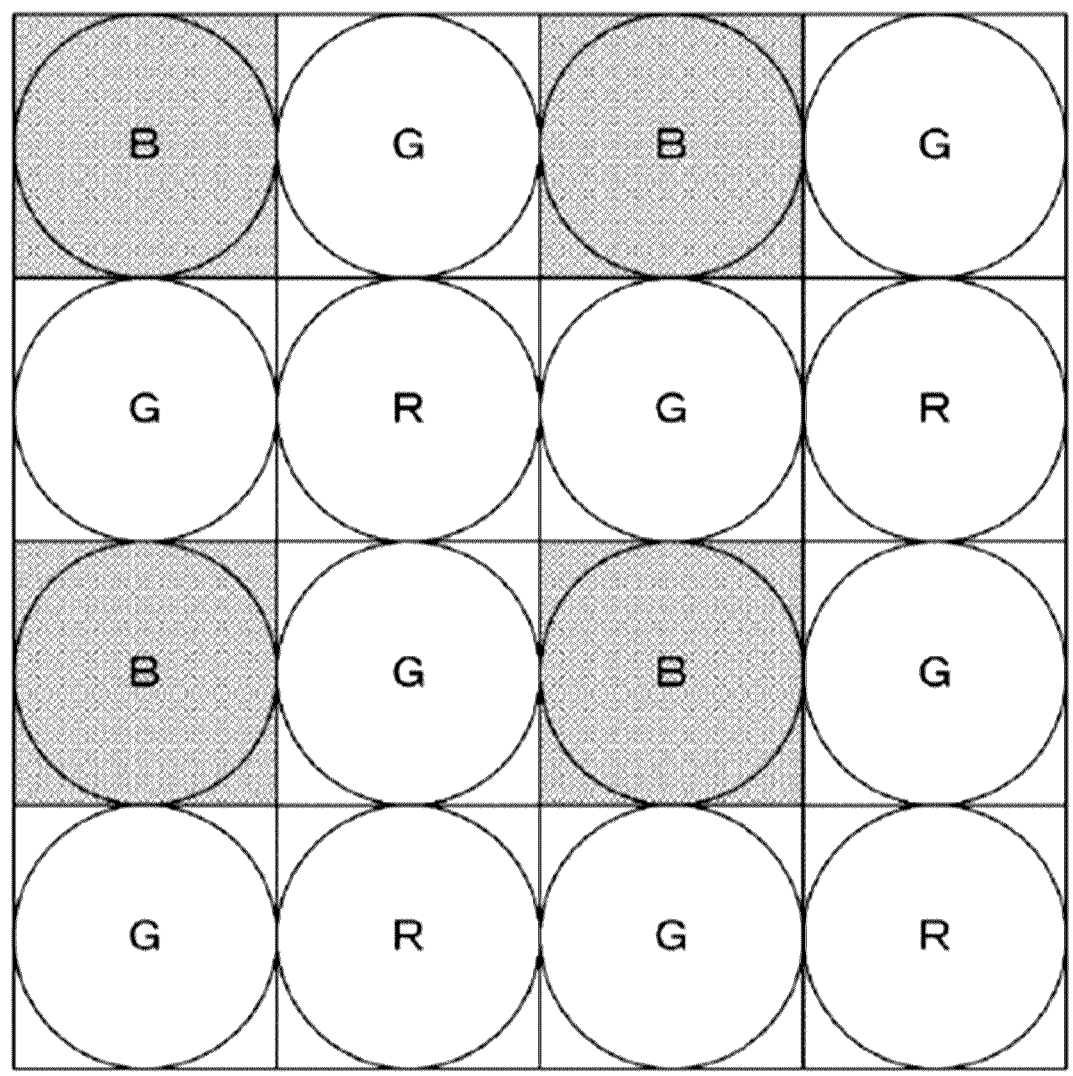

[Fig. 7]
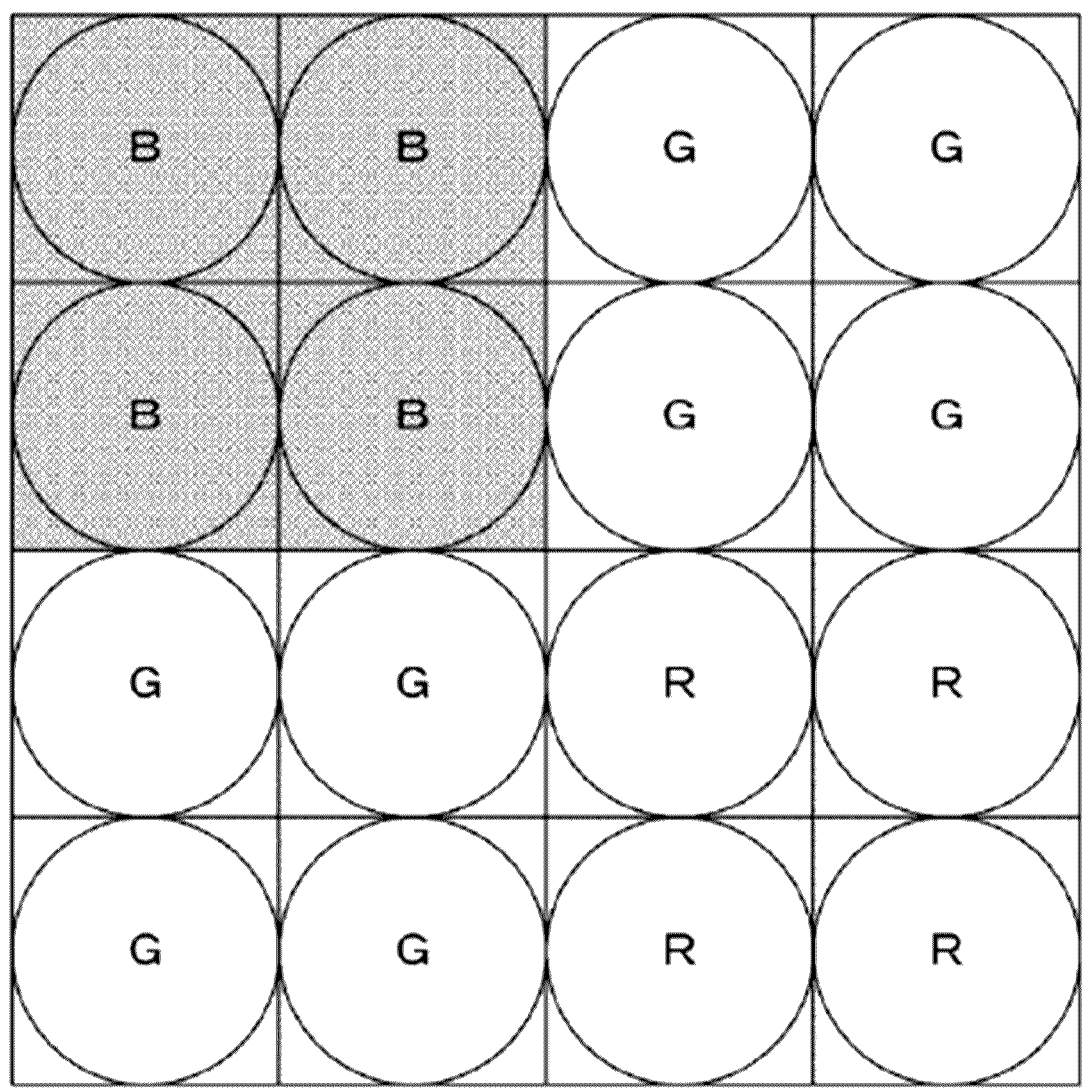

[Fig. 8]
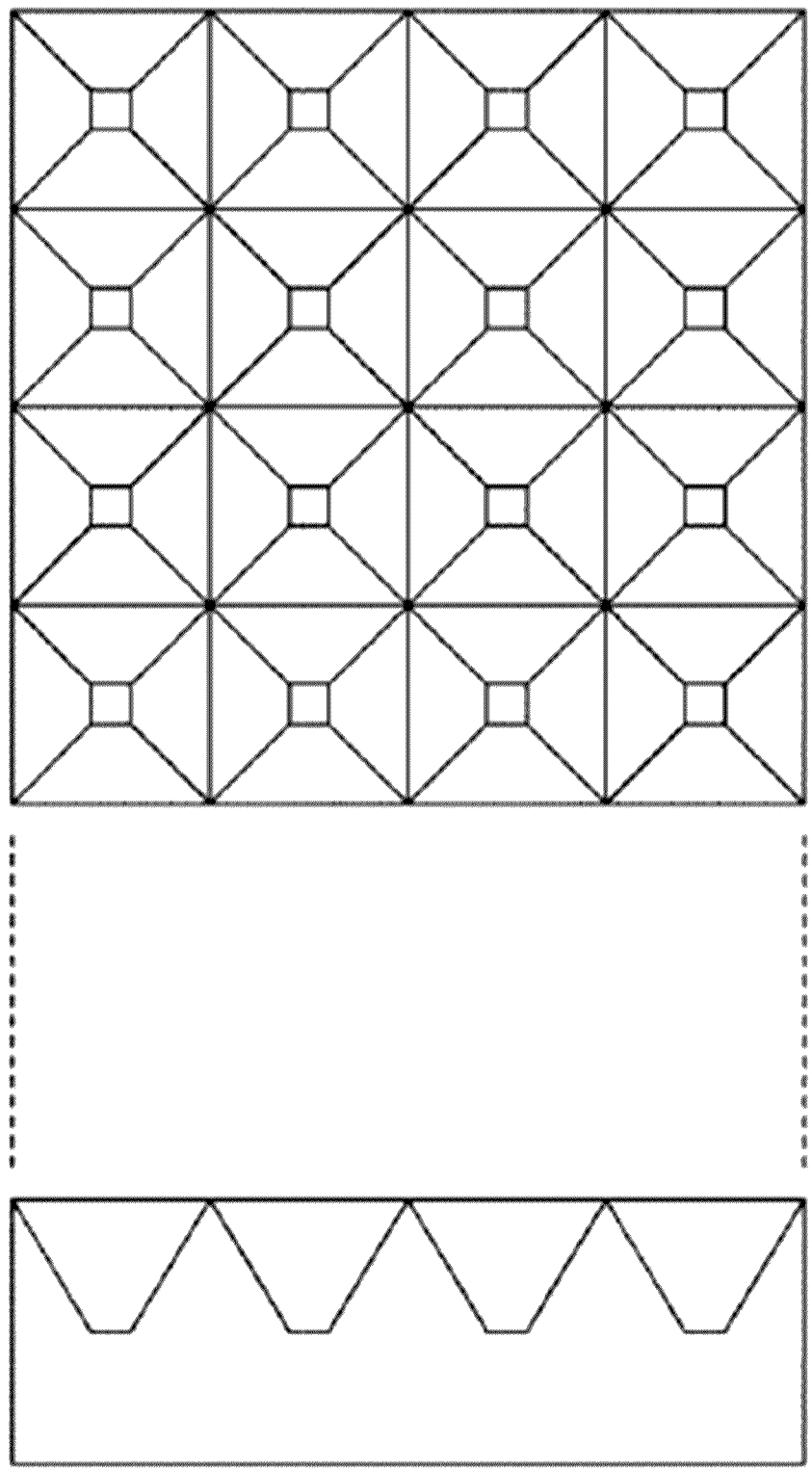

[Fig. 9]
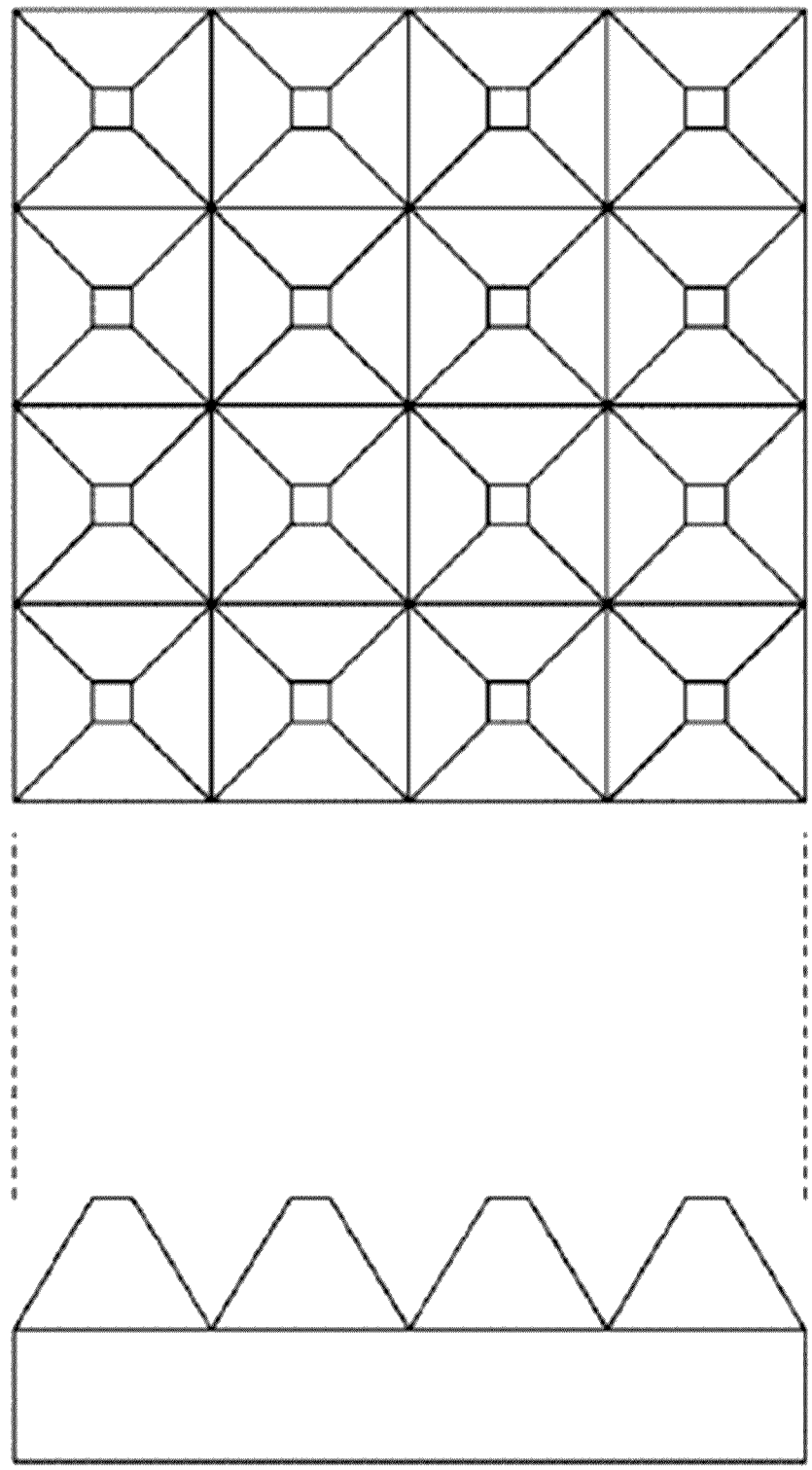

[Fig. 10]
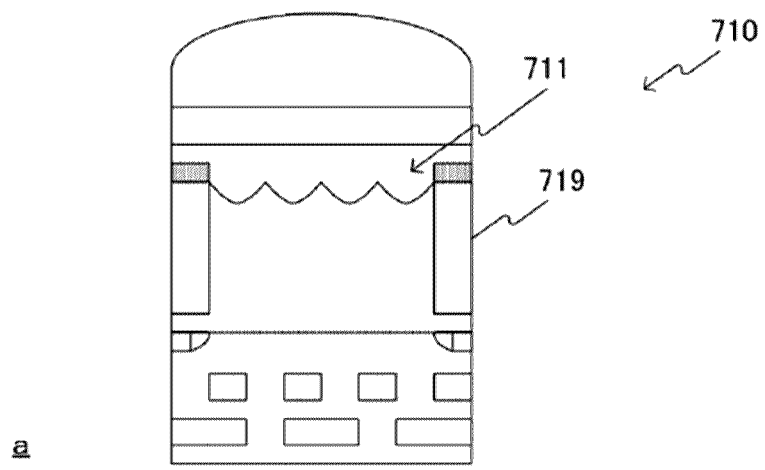
a
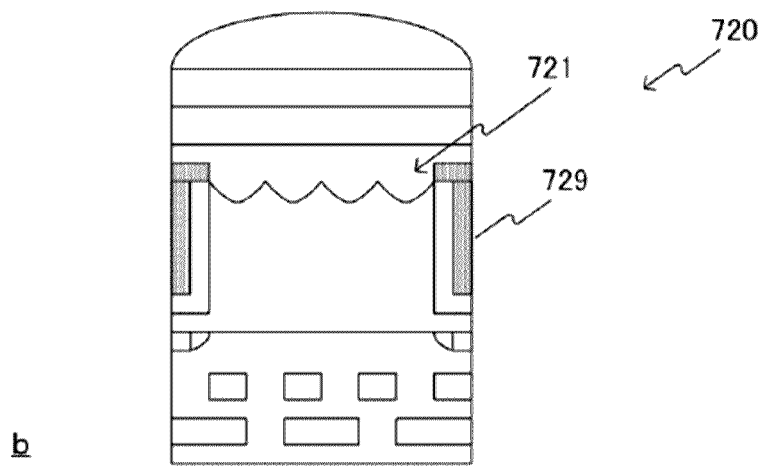
b
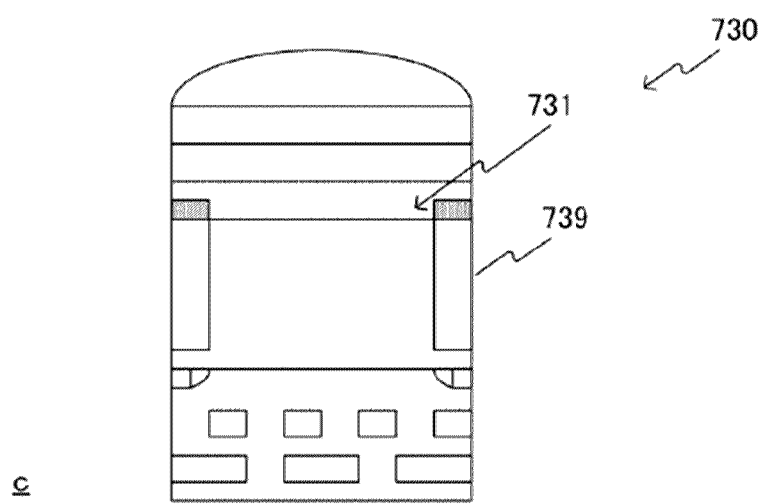
c

[Fig. 11]
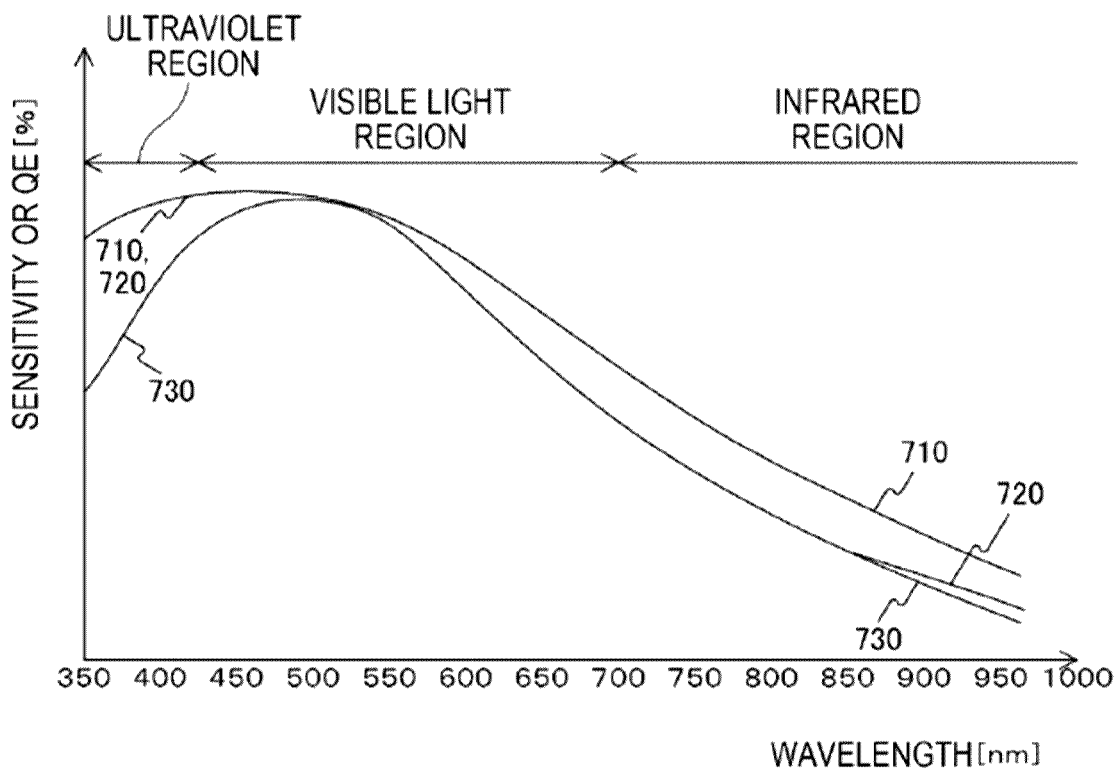
a
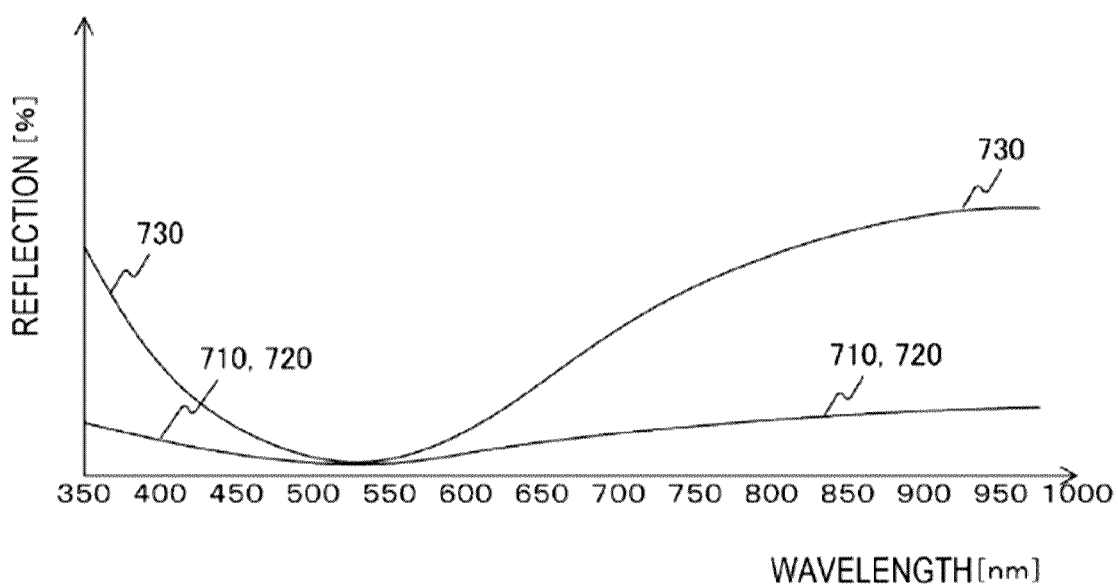
b

[Fig. 12]
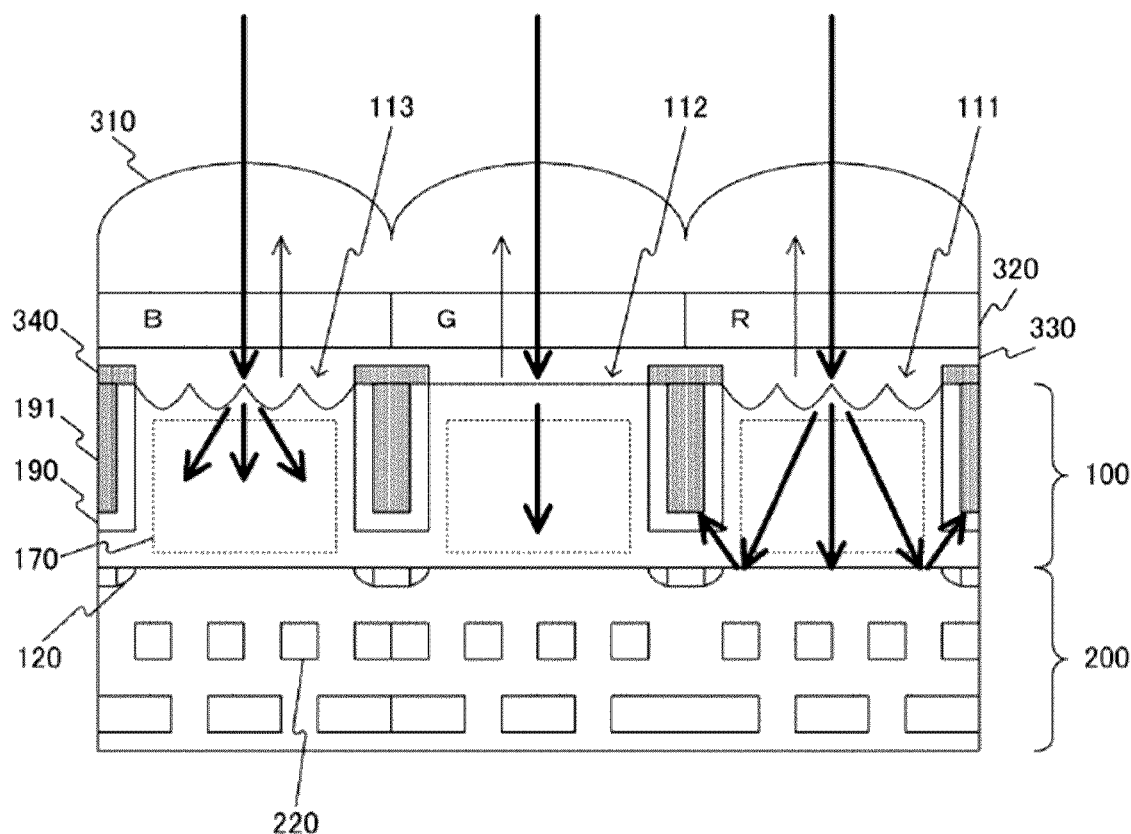

[Fig. 13]
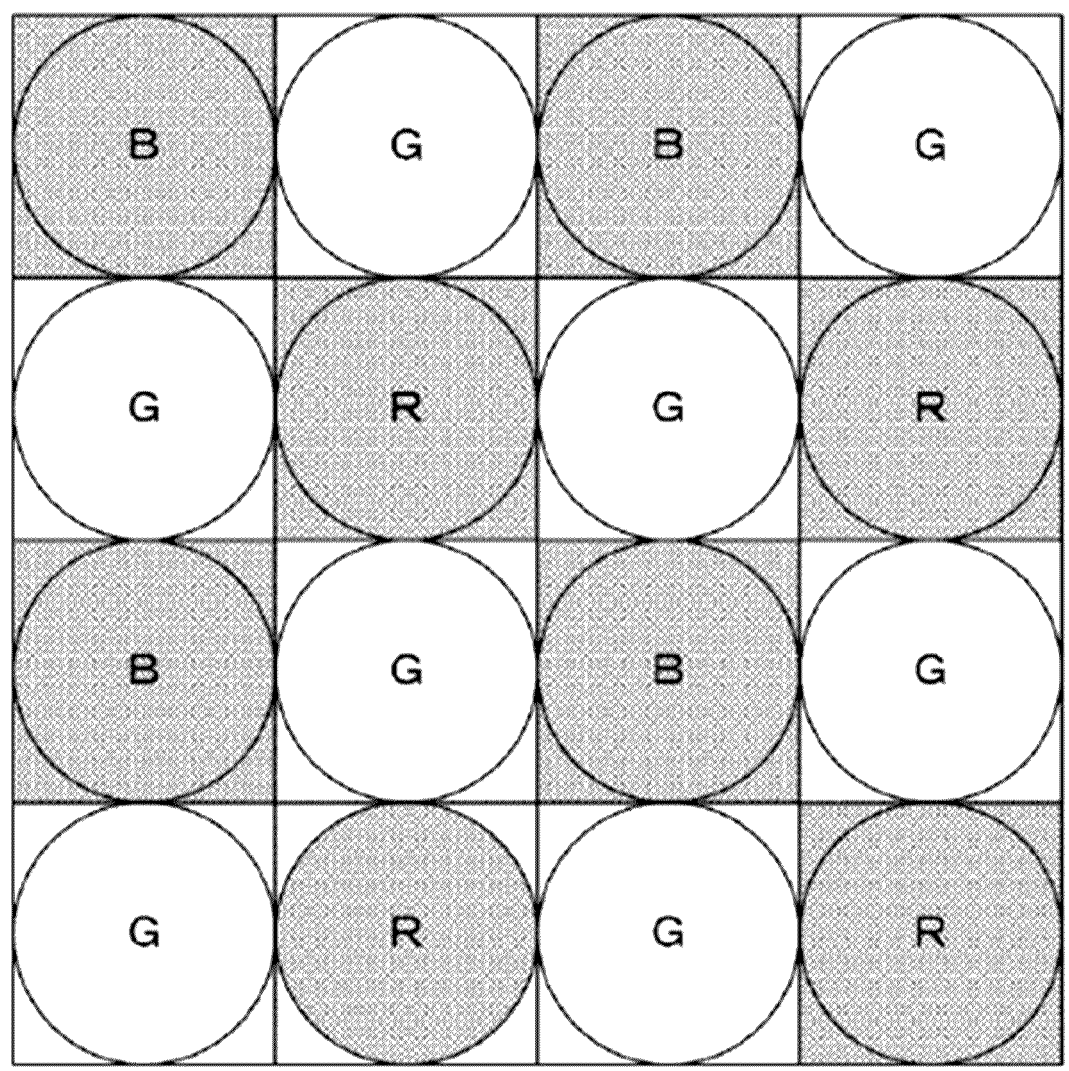

[Fig. 14]
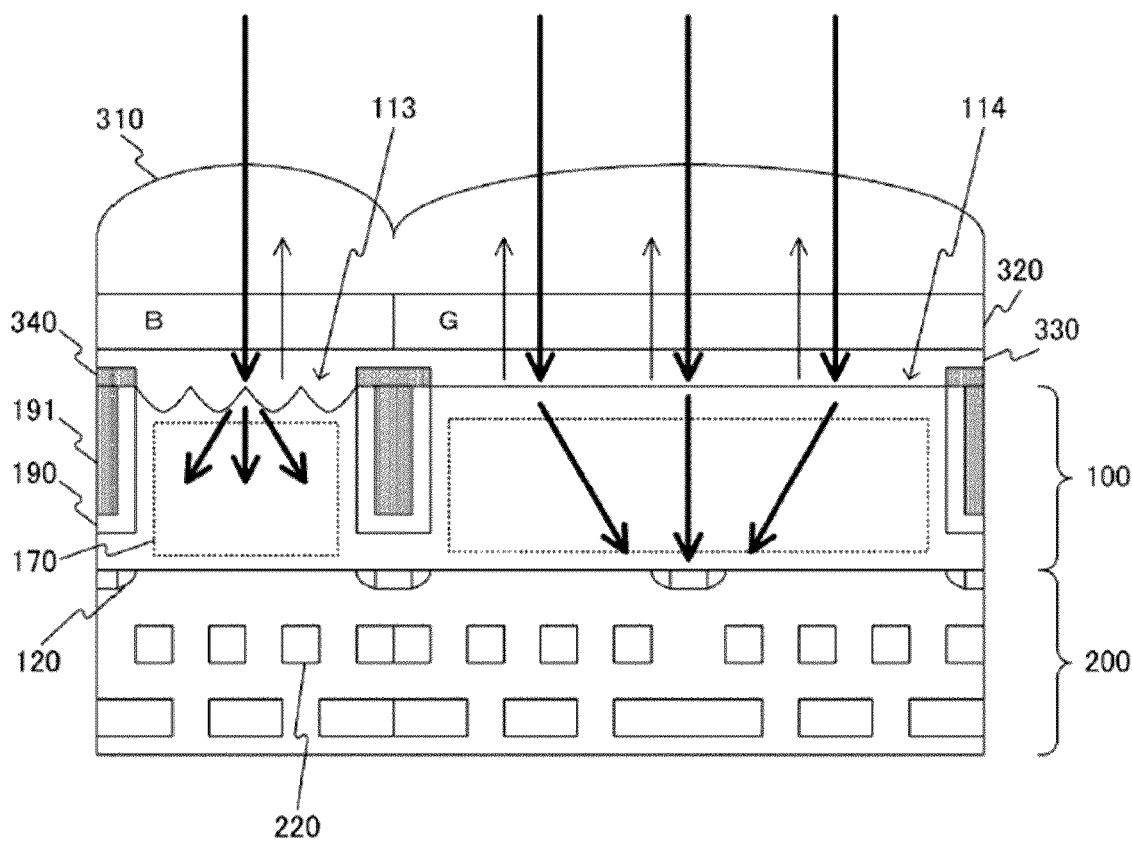

[Fig. 15]
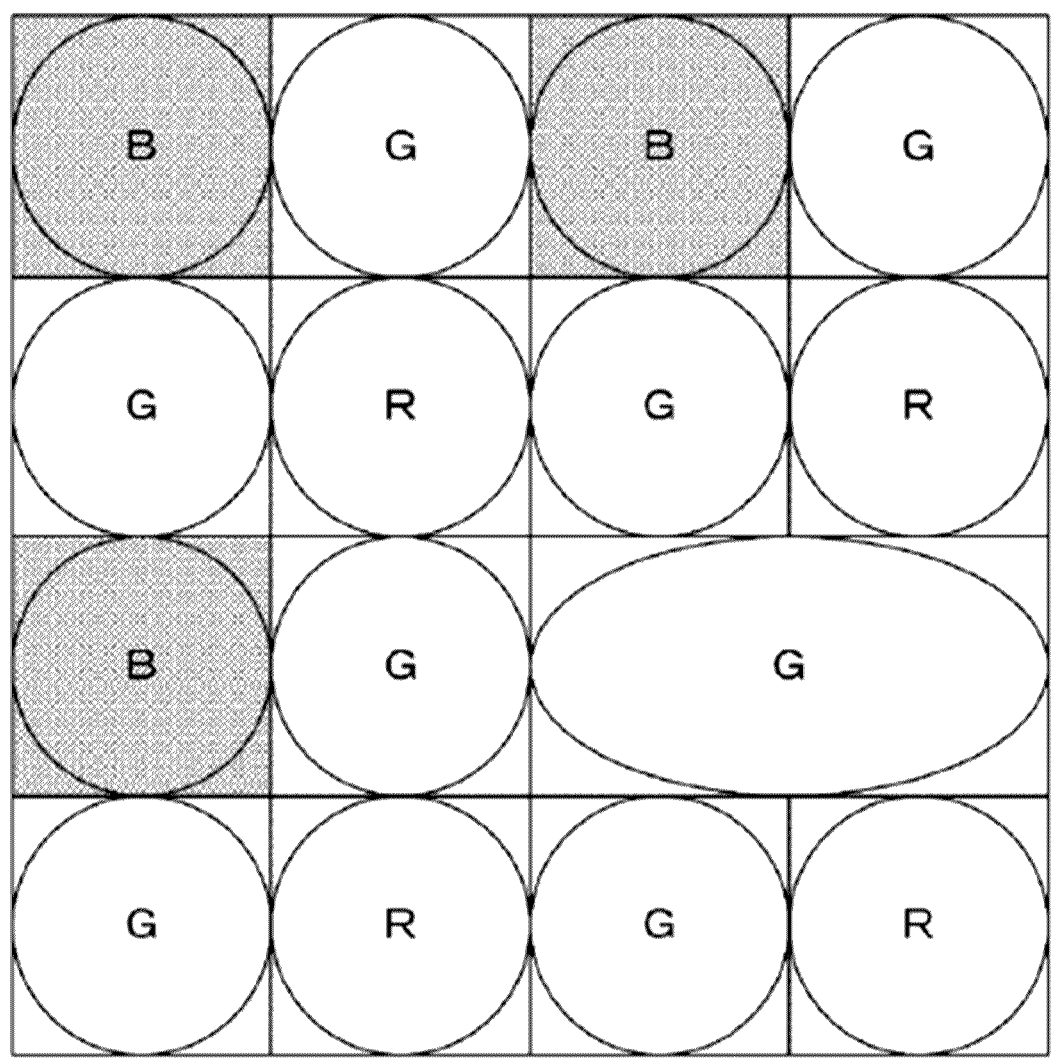

[Fig. 16]
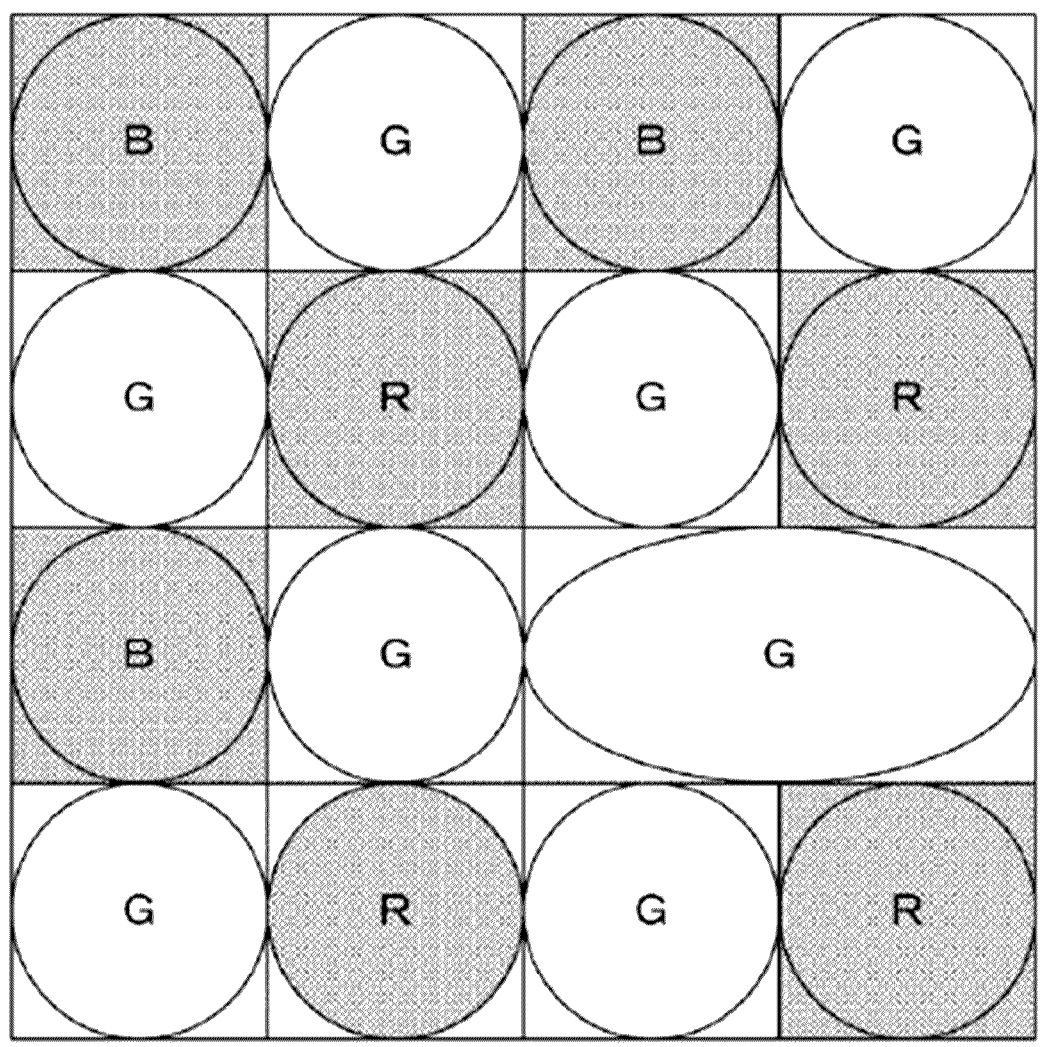

[Fig. 17]
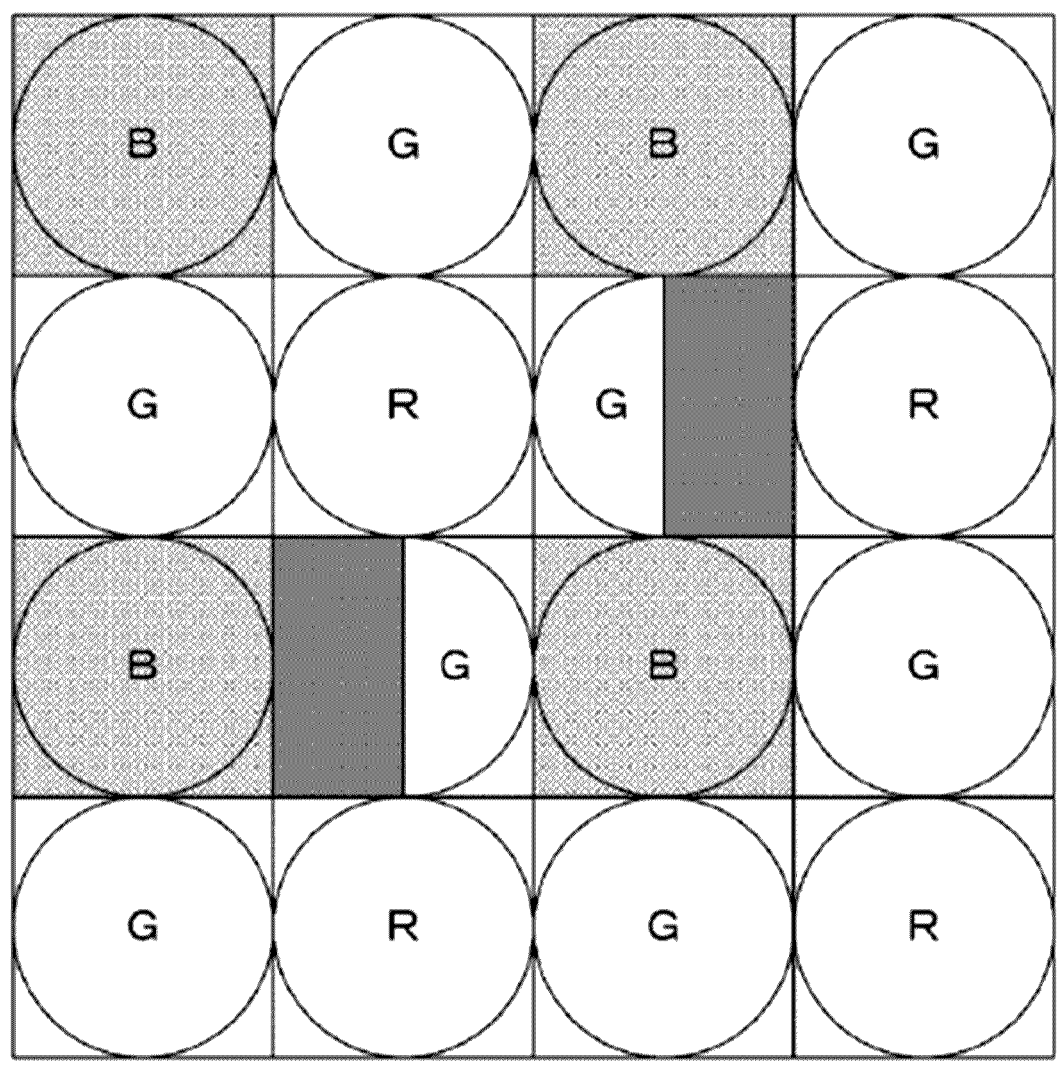

[Fig. 18]
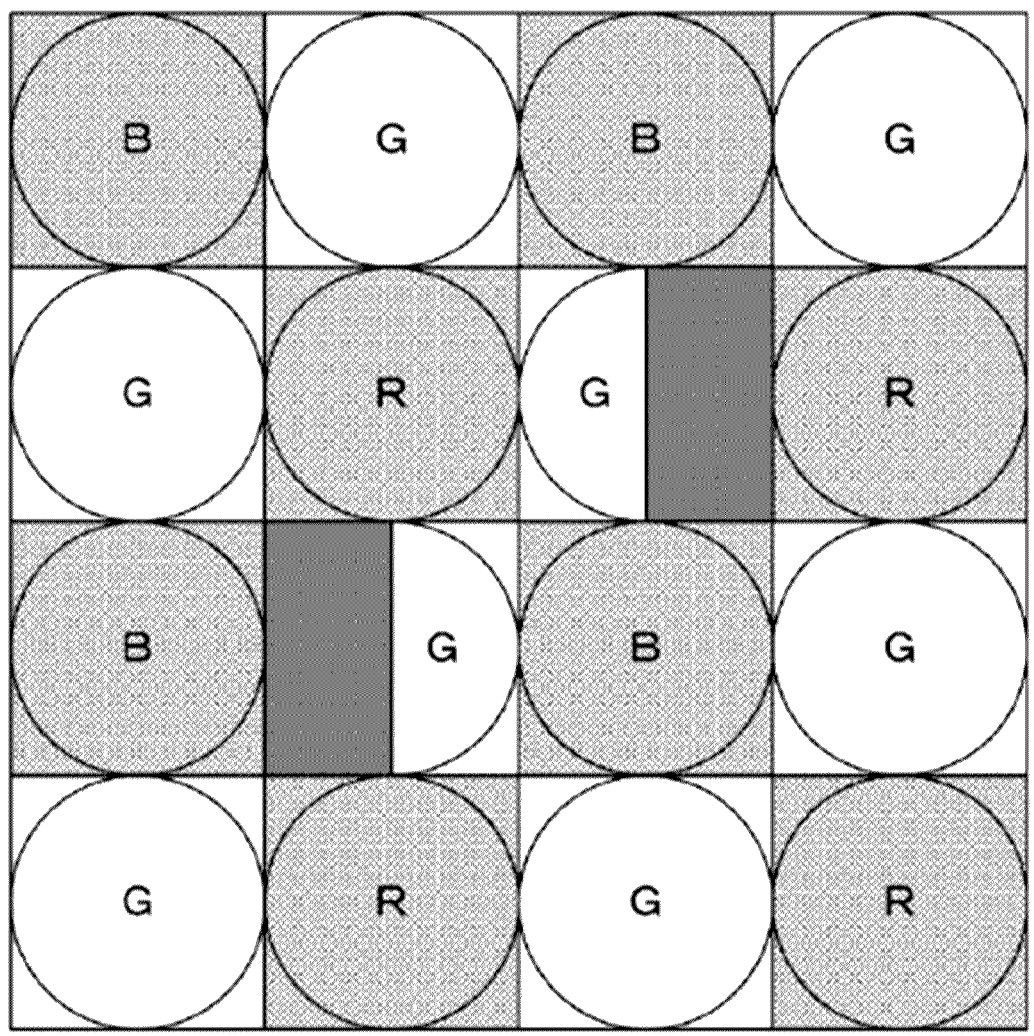

[Fig. 19]
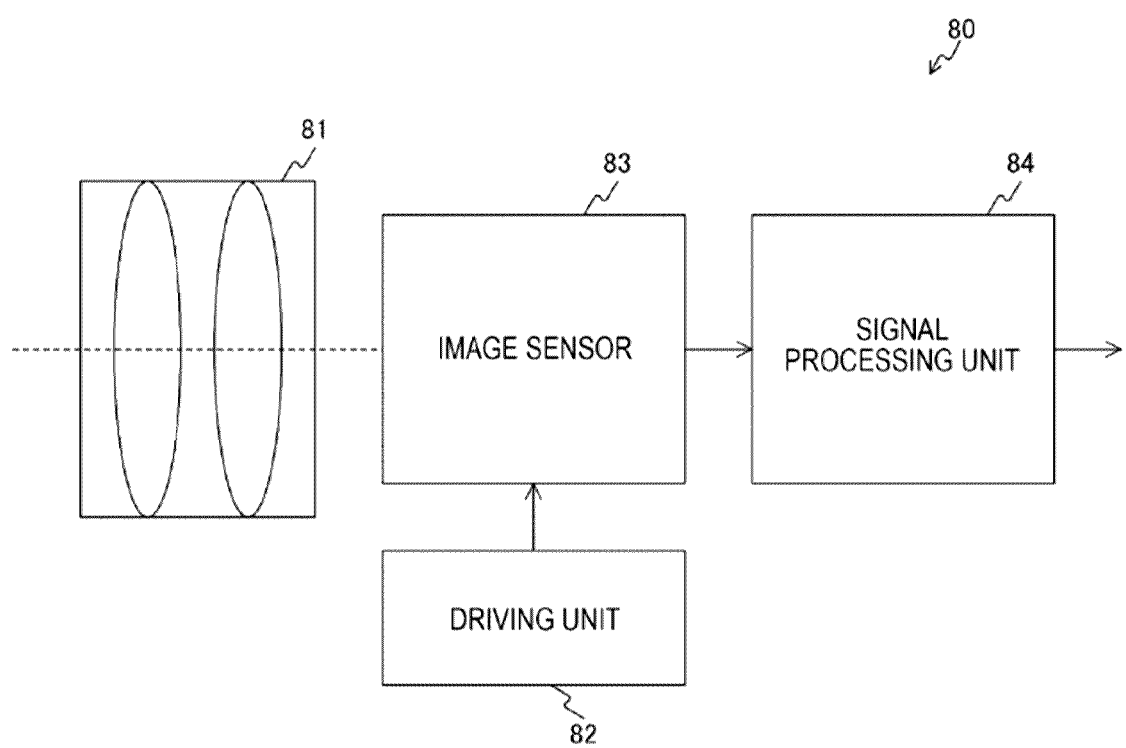

[Fig. 20]
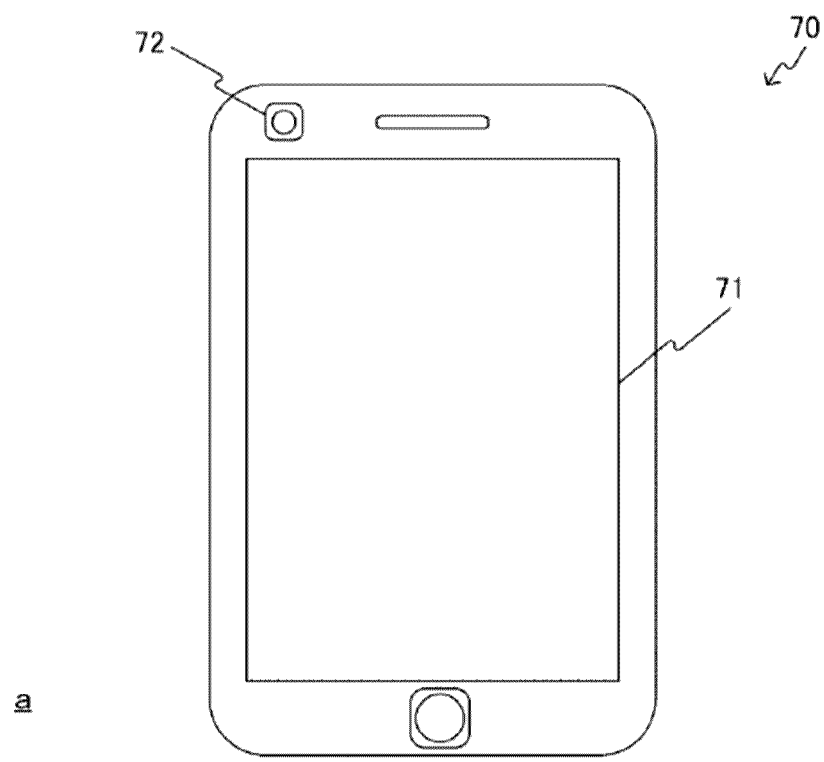
a
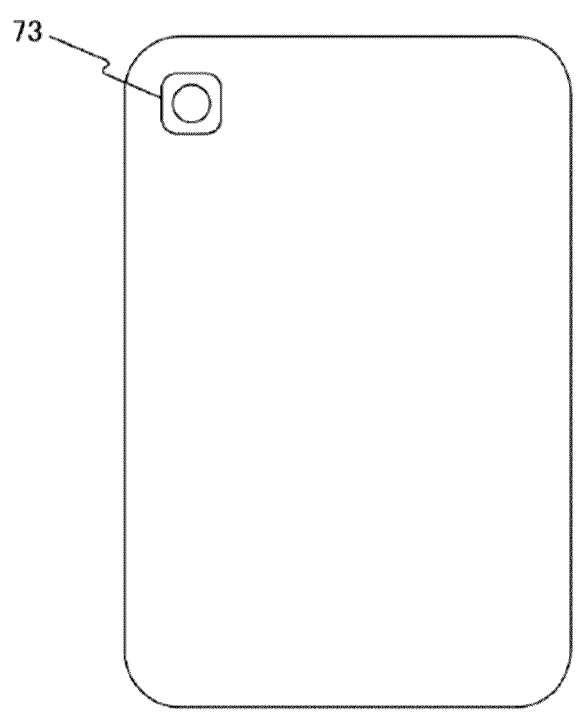
b

[Fig. 21]
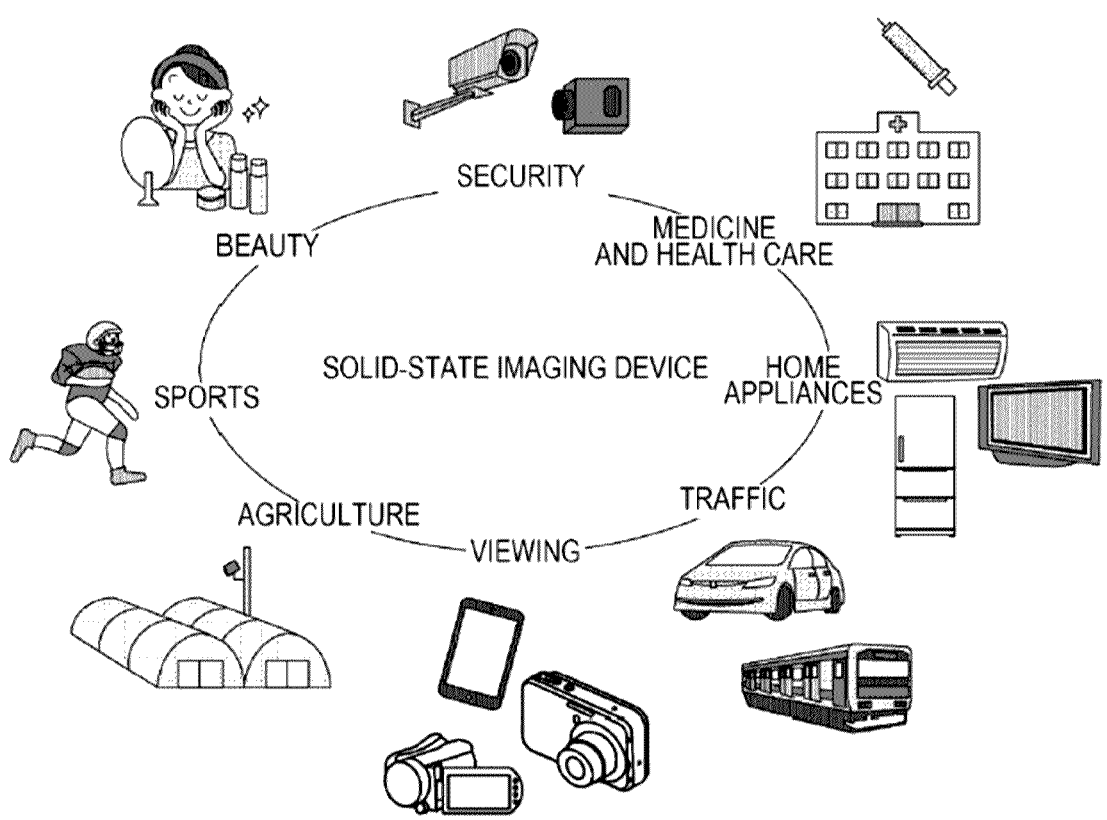

[Fig. 23]

[Fig. 25]
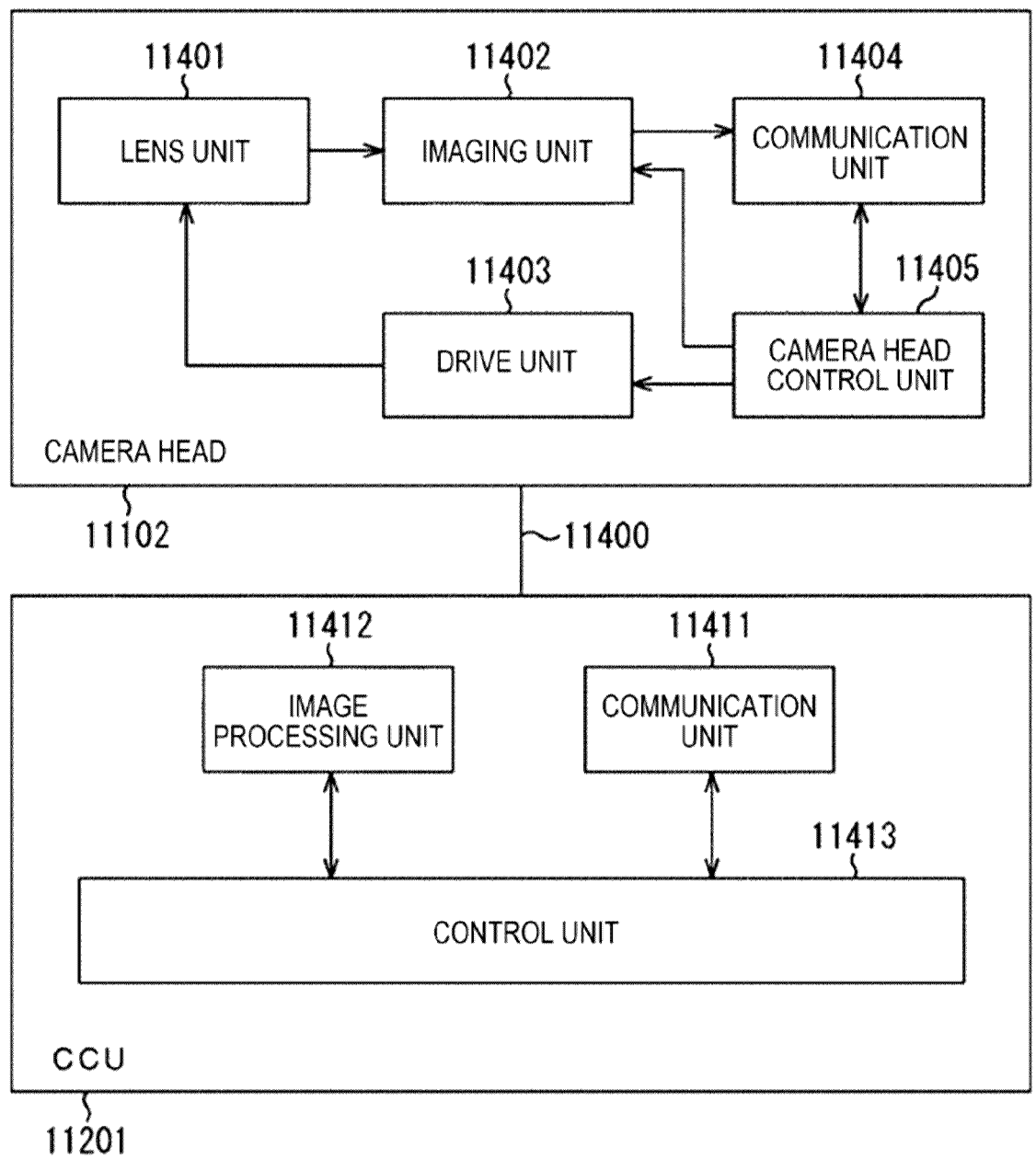

SOLID-STATE IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2018/026604 having an international filing date of 13 Jul. 2018, which designated the United States, which PCT application claimed the benefit of Japanese Priority Patent Application No. 2017-168260 filed on 1 Sep. 2017, the disclosures of each of which are incorporated herein by reference in their entirety.

TECHNICAL FIELD

The present technology relates to a solid-state imaging device (or imaging device). More particularly, the present technology relates to a solid-state imaging device and an electronic apparatus (or electronic device) which each include an antireflective layer on a light-receiving surface.

BACKGROUND ART

CMOS image sensors that use crystalline silicon to absorb light have high sensitivity to visible wavelengths to infrared wavelengths, but are optimized in general to have high sensitivity to green wavelengths for the sensitivity of human eyes. For example, as the color arrangement of RGB sensors, two pixels of 2×2 unit pixel arrangement are green, and the remaining pixels are red and blue. In addition, an antireflective coat is applied between a silicon board and an upper layer, and the antireflective coat is optimized to reduce reflection of green. The antireflective coating implemented in an upper layer of a sensor pixel of an image sensor is a simple λ/4 wave plate in a usual case. Therefore, in the case where the antireflective coating is optimized, for example, to suppress reflection of green, a sufficient antireflective effect is not obtained for blue and red wavelengths. Moreover, large reflection components in ultraviolet and infrared wavelengths unfortunately cause degraded image quality such as decreased sensitivity or flare ghosts. Therefore, for example, a solid-state imaging device is proposed that has a minute concave-convex structure on the border of a silicon layer on the light-receiving surface side on which photo diodes are formed (see, for example, PTL 1 and NPL 1).

CITATION LIST

Patent Literature

PTL 1: JP 2015-029054A

Non Patent Literature

NPL 1: Yokogawa, Sozo, et al. "IR sensitivity enhancement of CMOS Image Sensor with diffractive light trapping pixels." Scientific Reports 7 (2017)

SUMMARY

Technical Problem

The above-described traditional technology provides a minute concave-convex structure to the boarder of the silicon layer on the light-receiving surface to prevent (or alternatively, reduce) the reflection of incident light and improve the sensitivity. However, in this case, the concave-convex structure diffracts light in the silicon. Accordingly, for example, with respect to pixels having long-wavelength components and having the small light absorption coefficients of the silicon for red rays, infrared rays, and the like, the diffracted light can enter neighboring pixels to cause degraded color reproducibility or degraded spatial resolution.

The present technology has been devised in view of such circumstances. The present technology both improves the sensitivity of an image sensor in a wide wavelength band, and improves resolution.

Solution to Problem

According to an embodiment of the present technology, an imaging device includes a first photoelectric conversion region receiving light within a first range of wavelengths, a second photoelectric conversion region receiving light within a second range of wavelengths, and a third photoelectric conversion region receiving light within a third range of wavelengths. At least a portion of a light-receiving surface of the first photoelectric conversion region has a first concave-convex structure, and a light-receiving surface of the second photoelectric conversion region has a different structure than the first concave-convex structure.

The different structure of the light-receiving surface of the second photoelectric conversion region is planar, and a light-receiving surface of the third photoelectric conversion region is planar.

At least a portion of a light-receiving surface of the third photoelectric conversion region has a second concave-convex structure.

The first range of wavelengths corresponds to blue light, the second range of wavelengths corresponds to green light, and the third range of wavelengths corresponds to red light.

The imaging device includes a first color filter that passes light corresponding to the first range of wavelengths and that overlaps the first photoelectric conversion region, a second color filter that passes light corresponding to the second range of wavelengths and that overlaps the second photoelectric conversion region, and a third color filter that passes light corresponding to the third range of wavelengths and that overlaps the third photoelectric conversion region.

The imaging device includes a first anti-reflective layer disposed on the light-receiving surface of the first photoelectric conversion region. The first anti-reflective layer has the first concave-convex structure.

The imaging device includes a second anti-reflective layer disposed on the light-receiving surface of the second photoelectric conversion region. The second antireflective layer has the different structure.

A thickness of the second anti-reflective layer is one-quarter of a selected one of the wavelengths within the second range of wavelengths. The different structure is a planar structure.

The imaging device includes a third anti-reflective layer disposed on a light receiving surface of the third photoelectric conversion element. A thickness of the third antireflective layer is one-quarter of a selected one of the wavelengths within the third range of wavelengths, and the third antireflective layer is planar. The portion of the light-receiving surface of the first photoelectric conversion element having the first concave-convex structure comprises silicon. The first concave-convex structure is one of a pyramid structure or an inverted pyramid structure. An angle formed by sides of the pyramid structure with respect to a surface of the silicon is about 55 degrees. The surface of the silicon is a (100) surface and the sides of the pyramid structure are (111) surfaces. At least a portion of a light-receiving surface of the third photoelectric conversion region has a second concave-convex structure. The first range of wavelengths corresponds to blue light and the third range of wavelengths corresponds to red light. The first and second concave-convex structures are periodic.

According to an embodiment of the present technology, an electronic device includes a signal processor and an imaging device. The imaging device includes a first photoelectric conversion region receiving light within a first range of wavelengths, a second photoelectric conversion region receiving light within a second range of wavelengths, and a third photoelectric conversion region receiving light within a third range of wavelengths. At least a portion of a light-receiving surface of the first photoelectric conversion region has a concave-convex structure. A light-receiving surface of the second photoelectric conversion region has a different structure than the concave-convex structure.

Advantageous Effects of Invention

According to an embodiment of the present technology, the advantageous effects can be attained that improve both the sensitivity of an image sensor in a wide wavelength band and resolution. Note that effects described herein are not necessarily limiting, and any effect described in the present disclosure may be achieved.

BRIEF DESCRIPTION OF DRAWINGS

FIG. 1 is a diagram illustrating a configuration example of a solid-state imaging device according to an embodiment of the present technology.

FIG. 2 is a diagram illustrating a disposition example of the solid-state imaging device according to an embodiment of the present technology.

FIG. 3 is a diagram illustrating a circuit configuration example of a pixel 11 according to an embodiment of the present technology.

FIG. 4 is an example of a plan view of a semiconductor board of a pixel according to an embodiment of the present technology.

FIG. 5 is an example of a cross-sectional view of a pixel according to a first embodiment of the present technology.

FIG. 6 is a diagram illustrating a first disposition example of a color filter 320 and an antireflective layer according to the first embodiment of the present technology.

FIG. 7 is a diagram illustrating a second disposition example of the color filter 320 and the antireflective layer according to the first embodiment of the present technology.

FIG. 8 is a diagram illustrating an example of a periodic concave-convex structure according to an embodiment of the present technology.

FIG. 9 is a diagram illustrating another example of the periodic concave-convex structure according to an embodiment of the present technology.

FIG. 10 is a diagram illustrating a pixel type for describing a characteristic of an image structure according to an embodiment of the present technology.

FIG. 11 is a diagram illustrating characteristics of three pixel types 710, 720, and 730 in FIG. 10 with respect to wavelengths.

FIG. 12 is an example of a cross-sectional view of a pixel according to a second embodiment of the present technology.

FIG. 13 is a diagram illustrating a disposition example of the color filter 320 and an antireflective layer according to the second embodiment of the present technology.

FIG. 14 is an example of a cross-sectional view of a pixel according to a third embodiment of the present technology.

FIG. 15 is a diagram illustrating a first disposition example of the color filter 320 and an antireflective layer according to the third embodiment of the present technology.

FIG. 16 is a diagram illustrating a second disposition example of the color filter 320 and the antireflective layer according to the third embodiment of the present technology.

FIG. 17 is a diagram illustrating a third disposition example of the color filter 320 and the antireflective layer according to the third embodiment of the present technology.

FIG. 18 is a diagram illustrating a fourth disposition example of the color filter 320 and the antireflective layer according to the third embodiment of the present technology.

FIG. 19 is a diagram illustrating a configuration example of an imaging device 80 that is an application example of an embodiment of the present technology.

FIG. 20 is a diagram illustrating an external appearance example of a mobile information terminal 70 that is an application example of an embodiment of the present technology.

FIG. 21 is a diagram illustrating an example of a field to which an embodiment of the present technology is applied.

FIG. 25 is a block diagram illustrating an example of functional configurations of a camera head 11102 and a CCU 11201 illustrated in FIG. 24.

DESCRIPTION OF EMBODIMENTS

Figure 22:
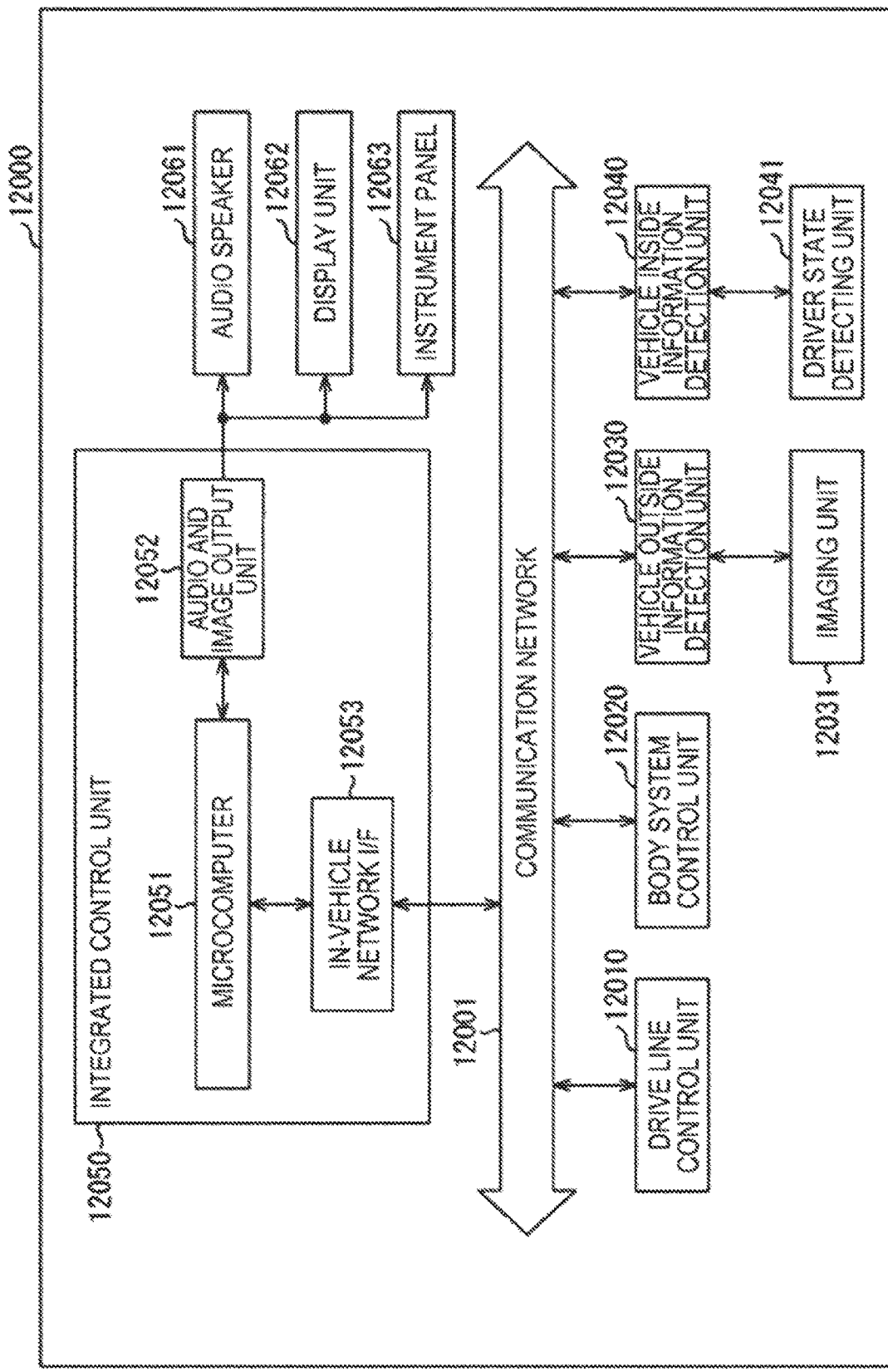
FIG. 22 is a block diagram illustrating a schematic configuration example of a vehicle control system that is an example of a mobile object control system to which the technology according to an embodiment of the present disclosure can be applied.

The following describes an example for implementing the present technology (which will be referred to as embodiment below). Description will be made in the following order.

1. First Embodiment (Example in Which Only Blue Pixel Has Concave-Convex Structure)
2. Second Embodiment (Example in Which Red Pixel Also Has Concave-Convex Structure)
3. Third Embodiment (Example in Which Phase Difference Detection Pixel Has No Concave-Convex Structure)
4. Application Example 1. First Embodiment Configuration of Solid-State Imaging Device FIG. 1 is a diagram illustrating a configuration example of a solid-state imaging device according to an embodiment of the present technology. This solid-state imaging device includes a pixel region 10 and peripheral circuitry. The peripheral circuitry includes a vertical drive circuit 20, a horizontal drive circuit 30, a control circuit 40, a column signal processing circuit 50, and an output circuit 60.

The pixel region 10 is a pixel array in which a plurality of pixels 11 including photoelectric conversion units (or photoelectric conversion regions) are arranged in a two-dimensional array. These pixels 11 each include, for example, a photo diode to convert light into electric charge, and a plurality of pixel transistors. Here, the plurality of pixel transistors can include four transistors, for example, a transfer transistor, a reset transistor, a selection transistor, and an amplifier transistor.

The vertical drive circuit 20 drives the pixels 11 in units of rows. This vertical drive circuit 20 includes, for example, a shift register. This vertical drive circuit 20 selects a pixel driving line, and supplies the selected pixel driving line with pulses for driving the pixels 11. This allows the vertical drive circuit 20 to select and scan the respective pixels 11 of the pixel region 10 in units of rows one after another in the vertical direction. The vertical drive circuit 20 supplies the column signal processing circuit 50 via a vertical signal line 19 with pixel signals based on signal charge generated by the photoelectric conversion unit of each pixel 11 in accordance with the amount of received light.

The horizontal drive circuit 30 drives the column signal processing circuit 50 in units of columns. This horizontal drive circuit 30 includes, for example, a shift register. This horizontal drive circuit 30 outputs horizontal scanning pulses one by one to select the respective column signal processing circuits 50 in order. The horizontal drive circuit 30 causes the output circuit 60 to output a pixel signal from each column signal processing circuit 50 via the horizontal signal line 59.

The control circuit 40 controls the entire solid-state imaging device. This control circuit 40 receives an input clock and data for an instruction of an operation mode or the like. The control circuit 40 outputs data such as internal information of the solid-state imaging device. That is, this control circuit 40 generates, on the basis of vertical synchronization signals, horizontal synchronization signals, and master clocks, clock signals and control signals on which the operations of the vertical drive circuit 20, the column signal processing circuit 50, the horizontal drive circuit 30, and the like are based. The control circuit 40 then inputs these signals into the vertical drive circuit 20, the column signal processing circuit 50, the horizontal drive circuit 30, and the like.

The column signal processing circuit 50 is disposed, for example, for each column of the pixels 11. The column signal processing circuit 50 performs signal processing such as noise removal for each pixel column on signals output from the pixels 11 corresponding to one row. That is, this column signal processing circuit 50 performs signal processing such as correlated double sampling (CDS), signal amplification, and analog-to-digital (AD) conversion for removing fixed-pattern noise specific to the pixels 11. A horizontal selection switch not illustrated is connected between the output stage of the column signal processing circuit 50 and the horizontal signal line 59.

The output circuit 60 performs signal processing on signals supplied one by one from each column signal processing circuit 50 through the horizontal signal line 59, and outputs the resulting signals. At that time, this output circuit 60 buffers the signals from the column signal processing circuit 50. In addition, this output circuit 60 may perform black-level adjustment, column variation correction, various kinds of digital signal processing, and the like on the signals from the column signal processing circuit 50.

FIG. 2 is a diagram illustrating a disposition example of the solid-state imaging device according to an embodiment of the present technology.

As illustrated in a of the figure, in the case where the solid-state imaging device is disposed as a non-stacked solid-state imaging device, a pixel region 91 in which pixels are disposed in an array, a control region 92 in which the driving control of pixels and other various kinds of control are performed, and a logic circuit 93 for signal processing are disposed on one board.

As illustrated in b and c of the figure, in the case the solid-state imaging device is disposed as a stacked solid-state imaging device, some division examples are conceivable. b of the figure illustrates a first division example. In this first division example, a first semiconductor chip is equipped with the pixel region 91 and the control region 92. A second semiconductor chip is equipped with the logic circuit 93. The first semiconductor chip is then electrically connected to the second semiconductor chip, constituting the solid-state imaging device.

b of the figure illustrates a second division example. In this second division example, a first semiconductor chip is equipped with the pixel region 91. A second semiconductor chip is equipped with the control region 92 and the logic circuit 93. The first semiconductor chip is then electrically connected to the second semiconductor chip, constituting the solid-state imaging device.

Circuit Configuration of Pixel

FIG. 3 is a diagram illustrating a circuit configuration example of the pixel 11 according to an embodiment of the present technology.

The pixels 11 each include a photo diode 17, a transfer transistor 12, a floating diffusion region 13, a reset transistor 14, an amplifier transistor 15, and a selection transistor 16. These four transistors of the transfer transistor 12, the reset transistor 14, the amplifier transistor 15, and the selection transistor 16 are referred to as pixel transistors. Note that this example assumes that the pixel transistors are MOS transistors having N-type carrier polarity.

In addition, the pixels 11 are each provided with three signal lines including a transfer signal line, a reset signal line, and a selection signal line in the row direction. The pixels 11 are each provided with the vertical signal line 19 in the column direction. In addition, the drain sides of the reset transistor 14 and the amplifier transistor 15 are supplied with power source voltage Vdd.

The photo diode (PD) 17 is a photoelectric conversion unit that generates the charge corresponding to incident light. Note that the anode of this photo diode 17 is grounded.

The transfer transistor 12 is a transistor that transfers the charge produced in the photo diode 17. This transfer transistor 12 is provided between the cathode of the photo diode 17 and the floating diffusion region 13. When the gate of this transfer transistor 12 receives high-level signals from the vertical drive circuit 20 via the transfer signal line, the transfer transistor 12 enters an on state to transfer the charge subjected to photoelectric conversion by the photo diode 17 to the floating diffusion region 13.

The floating diffusion (FD) region 13 is a diffusion region in which the charge transferred by the transfer transistor 12 is converted into voltage signals. The voltage signals of this floating diffusion region 13 are connected to the drain of the reset transistor 14 and the gate of the amplifier transistor 15.

The reset transistor 14 is a transistor for resetting the voltage of the floating diffusion region 13. This reset transistor 14 is provided between the power source voltage Vdd and the floating diffusion region 13. When the gate of this reset transistor 14 receives high-level signals from the vertical drive circuit 20 via the reset signal line, the reset transistor 14 enters an on state to reset the potential of the floating diffusion region 13 as the power source voltage Vdd.

The amplifier transistor 15 is a transistor that amplifies the voltage signals of the floating diffusion region 13. The gate of this amplifier transistor 15 is connected to the floating diffusion region 13. The drain of the amplifier transistor 15 is connected to the power source voltage Vdd. The source of the amplifier transistor 15 is connected to the vertical signal line 19 via the selection transistor 16. This amplifier transistor 15 amplifies the voltage signals of the floating diffusion region 13, and outputs the amplified signals to the selection transistor 16 as pixel signals.

The selection transistor 16 is a transistor for selecting these pixels. This selection transistor 16 is provided between the amplifier transistor 15 and the vertical signal line 19. When the gate of this selection transistor 16 receives high-level signals from the vertical drive circuit 20 via the selection signal line, the selection transistor 16 enters an on state to output the voltage signals amplified by the amplifier transistor 15 to the vertical signal line 19.

Structure of Pixel

FIG. 4 is an example of a plan view of a semiconductor board of a pixel according to an embodiment of the present technology. An embodiment of the present technology assumes a structure in which four pixels share one floating diffusion region and the like, and other four pixels are further disposed in the vertical direction. However, this structure is an example. The present technology is also applicable to another pixel structure.

In this example, each pixel includes a photo diode 170 and a transfer gate 120. Four pixels share one floating diffusion region 130, one reset transistor 140, and one amplifier transistor 150.

The photo diode 170 and the floating diffusion region 130 have functions similar to the functions of the photo diode 17 and the floating diffusion region 13. In addition, the transfer gate 120, the reset transistor 140, and the amplifier transistor 150 have functions similar to the functions of the transfer transistor 12, the reset transistor 14, and the amplifier transistor 15 in the above-described circuit example. Note that the photo diode 170 and the floating diffusion region 130 are an example of the photoelectric conversion unit in the Claims.

FIG. 5 is an example of a cross-sectional view of a pixel according to a first embodiment of the present technology. The figure illustrates the cross section over three pixels which is taken along A-B in the plan view of FIG. 4. Here, a solid-state imaging device whose back face is irradiated is used as an example. The upper part of the figure represents the back face of a semiconductor board 100, and the lower part represents the front face of the semiconductor board 100.

The back face of the semiconductor board 100 includes, as an optical system, an on-chip lens 310 for each of pixels that are two-dimensionally disposed. Light is incident via this on-chip lens 310. The on-chip lens 310 includes a resin-based material, for example, a styrene-based resin, an acryl-based resin, a styrene-acryl copolymer resin, a siloxane-based resin, or the like.

The lower part of the on-chip lens 310 includes a color filter 320 for each of pixels that are two-dimensionally disposed. This color filter 320 is an on-chip color filter that transmits a different type of wavelength band (i.e., ranges of wavelengths) for each pixel. This example assumes Bayer arrangement. The color filters 320 are disposed to transmit wavelength bands of blue (B), green (G), and red (R) in order from the left in this cross section. These color filters 320 are formed by performing spin coating on a photosensitive resin including, for example, coloring matter such as a pigment and a dye. Each of these color filters 320 only has to support any of at least three different types of wavelength bands in general. For example, filters are used that support any three or more types of infrared, red, green, blue, ultraviolet, and achromatic wavelength bands. Here, an achromatic filter is a filter that transmits all the visible near-infrared wavelength bands.

Below the color filter 320, a light-shielding film 340 for isolating pixels is formed in the region of a pixel boarder on the semiconductor board 100. A material for the light-shielding film 340 only has to shield light. For example, tungsten (W), aluminum (Al), copper (Cu), or the like is usable. There is a planarization film 330 formed between the color filter 320 and the semiconductor board 100. As a material for the planarization film 330, for example, an organic material such as resin is usable.

The inside of the semiconductor board 100 is a light absorption layer. The photo diode 170 is provided to a portion defined by an element isolation unit 190. The photo diode 170 is formed, for example, as an N-type impurity region sandwiched by P-type semiconductor regions in the depth direction of the semiconductor board 100.

The element isolation unit 190 has a structure in which a trench structure 191 is embedded into the semiconductor board 100 that is a silicon board. Such a structure is referred to as deep trench isolation (DTI). This trench structure 191 is covered with an oxide film. For example, the trench structure 191 is loaded with a metallic material inside. It is desirable that this metallic material have high light-shielding performance to block diffracted light. As such a metallic material, for example, tungsten (W), aluminum (Al), copper (Cu), or a metallic alloy thereof can be used as a main component. In addition, the trench structure 191 may be loaded with a dielectric such as $SiO_2$, which has a relatively low refractive index with respect to silicon. A loaded metallic material having higher light-shielding performance leads to the higher effect that optical color mixture is suppressed and resolution is improved. However, a loaded dielectric sometimes improves sensitivity more.

The front face of the semiconductor board 100 includes pixel transistors. The figure illustrates the transfer gate 120, which is one of the pixel transistors. There is provided a wiring layer 200 to cover these pixel transistors. In the wiring layer 200, a wire 220 is covered with an insulating layer. This wire 220 can be a multilayer wire including a plurality of layers. The front face of the wiring layer 200 then includes a support board (not illustrated).

The light-receiving surface of a pixel on the back face of the semiconductor board 100 includes an antireflective layer for preventing (or alternatively, reducing) incident light from being reflected. In this example, an antireflective layer 112 of a pixel of a green filter, and an antireflective layer 111 of a pixel of a red filter are reflective plates including $\lambda/4$ wave plates. Each of these $\lambda/4$ wave plates is a single-layer film having the thickness corresponding to a quarter of wavelength. Meanwhile, an antireflective layer 113 of a pixel of a blue filter has a periodic concave-convex structure. That is, the antireflective layers of pixels of only blue filters have periodic concave-convex structures among the color filters 320 in Bayer arrangement.

Arrows in the figure represent incident light downward and reflected light upward. The thickness represents the intensity of each light beam. The antireflective layer 112 of a pixel of a green filter is optimized for green, and thus appropriately suppresses reflection and causes the photo diode 170 to absorb incident light. Meanwhile, light incident on the antireflective layer 113 of a pixel of a blue filter is scattered by the periodic concave-convex structure and absorbed by the photo diode 170. Here, it should be understood that the PDs 170 are disposed in a silicon substrate and that that antireflective layers 111, 112, and 113 may be disposed on the silicon substrate above the PDs 170 and below the planarization film 330. The antireflective layers 111 and 112 may have a planar structure (i.e., substantially flat top and/or bottom surfaces)

Disposition of Antireflective Layer

FIG. 6 is a diagram illustrating a first disposition example of the color filter 320 and an antireflective layer according to the first embodiment of the present technology. As described above, it is assumed that the color filters 320 are disposed in Bayer arrangement. The antireflective layer of a pixel of only a blue filter then has a periodic concave-convex structure. The antireflective layer of a pixel of a filter having a different color is a reflective plate including a $\lambda/4$ wave plate. Note that, here, the antireflective layer of a pixel of only a blue filter has a periodic concave-convex structure, but the antireflective layer of a pixel of an ultraviolet filter may also have a periodic concave-convex structure.

FIG. 7 is a diagram illustrating a second disposition example of the color filter 320 and the antireflective layer according to the first embodiment of the present technology. In this example, the disposition of the color filters 320 are based on Bayer arrangement. However, in the above-described first disposition example, a different color is disposed for each pixel, but, in this second disposition example, pixels of filters having the same colors are disposed in units of pixels in Bayer arrangement. This figure uses four pixels including 2×2 pixels as a unit, but pixels may be disposed with more pixels used as a unit.

Periodic Concave-Convex Structure

FIG. 8 is a diagram illustrating an example of a periodic concave-convex structure according to an embodiment of the present technology. Here, as an example of the periodic concave-convex structure, a structure is illustrated in which inverted pyramid structures that are concave structures shaped like quadrangular pyramids are periodically disposed.

These inverted pyramid structures each includes a plane (111) of the crystal planes of silicon. This plane (111) is shown according to the Miller indices. An angle θ of this inverted pyramid structure with respect to the silicon board face is the plane (111) to a plane (100) of silicon, so that tan θ=$(2^{1/2})$ is satisfied. Thus, $\theta = \arctan(2^{1/2}) \approx 55°$ In other words, the silicon is etched such that the angle θ between a surface of the silicon board and an etched side surface that forms a side of the inverted pyramid structure is about 55°. In addition, in the inverted pyramid structure, the distance between adjacent pyramids, and the length of one side of each pyramid are from 200 nm to 800 nm, more preferably from 400 nm to 600 nm. In addition, it is desirable that the number of pyramids in the inverted pyramid structure be an integer number for each pixel.

To manufacture this inverted pyramid structure, for example, a photoresist is applied onto a P-type semiconductor on the back face of the semiconductor board 100. The photoresist is patterned according to lithography to provide an opening to a concave section. On the basis of the patterned photoresist, a dry etching process is then performed on the semiconductor board 100, and then the photoresist is removed. Note that, instead of the dry etching process, a wet etching process can also be used.

FIG. 9 is a diagram illustrating another example of the periodic concave-convex structure according to an embodiment of the present technology. Here, as an example of the periodic concave-convex structure, a structure is illustrated in which normal pyramid structures that are convex structures shaped like quadrangular pyramids are periodically disposed. The shape and size correspond to the inversion of the above-described example, so that detailed description will be omitted.

Characteristic

FIG. 10 is a diagram illustrating a pixel type for describing a characteristic of an image structure according to an embodiment of the present technology. This figure illustrates a response in the case where no color filters 320 are provided.

a of the figure illustrates, as a first pixel type 710, a structure in which an antireflective layer 711 has a periodic concave-convex structure, and a trench structure 719 of an element isolation unit is loaded with no metallic material. b of the figure illustrates, as a second pixel type 720, a structure in which an antireflective layer 721 has a periodic concave-convex structure, and a trench structure 729 of an element isolation unit is loaded with a metallic material having high light-shielding performance. c of the figure illustrates, as a third pixel type 730, a structure in which an antireflective layer 731 includes a planar reflective plate including a $\lambda/4$ wave plate, and a trench structure 739 of an element isolation unit is loaded with no metallic material.

FIG. 11 is a diagram illustrating characteristics of three pixel types 710, 720, and 730 in FIG. 10 with respect to wavelengths. a of the figure illustrates the sensitivity or quantum efficiency (QE) of photoelectric conversion for each wavelength. In addition, b of the figure illustrates a reflectance for each wavelength.

In the first pixel type 710, the antireflective layer 711 has a periodic concave-convex structure, so that the structure in itself has an effect as an antireflective film. Therefore, the sensitivity of blue and ultraviolet regions increases, and the reflection of red and infrared regions are also reduced. In addition, diffracted light extends the optical path length in silicon, so that the sensitivity to an infrared wavelength increases while the resolution is degraded.

In the second pixel type 720, similarly to the first pixel type 710, the antireflective layer 721 has a periodic concave-convex structure, so that the structure in itself has an effect as an antireflective film. Moreover, a metallic material loaded to the trench structure 729 of the element isolation unit absorbs diffracted light produced by the periodic concave-convex structure, resulting in less degraded resolution in an infrared wavelength.

In the third pixel type 730, the antireflective layer 731 causes high sensitivity to green regions and suppresses reflection of green, resulting in great reflection in the other wavelength regions.

Comparison of these shows that, as an effect brought about by a periodic concave-convex structure, reduced reflection improves chiefly the sensitivity of blue and ultraviolet regions. In addition, in the case where a trench structure of an element isolation unit is loaded with a metallic material, an effect of the absorption is shown to tend to decrease sensitivity in red or infrared regions. Thus, in the case where it is desirable to increase sensitivity in red or infrared regions, it is conceivable to load the trench structure of the element isolation unit with a dielectric.

In this way, according to the first embodiment of the present technology, the antireflective layer of a pixel of only a blue filter has a periodic concave-convex structure, which can reduce reflection in a blue wavelength region and improve sensitivity. In addition, a trench structure of an element isolation unit is loaded with a metallic material, which can prevent (or alternatively, reduce) diffracted light in a pixel on the long-wavelength side which has a small absorption coefficient especially for red and infrared wavelength bands and the like from entering a neighboring pixel, and prevent (or alternatively, reduce) color reproducibility and spatial resolution from degrading.

2. Second Embodiment

In the above-described first embodiment, only the antireflective layer of a pixel of only a blue filter has a periodic concave-convex structure. In contrast, this second embodiment is different in that the antireflective layer of a pixel of a red filter further has a periodic concave-convex structure as well. Note that the overall configuration of the solid-state imaging device is similar to that of the above-described first embodiment, so that detailed description will be omitted.

Structure of Pixel

FIG. 12 is an example of a cross-sectional view of a pixel according to a second embodiment of the present technology. The figure illustrates the cross section over three pixels which is taken along A-B in the plan view of FIG. 4. In addition, similarly to the first embodiment, a solid-state imaging device whose back face is irradiated is used. The upper part of the figure represents the back face of a semiconductor board 100, and the lower part represents the front face of the semiconductor board 100.

In this second embodiment, in addition to the antireflective layer 113 of a pixel of a blue filter, the antireflective layer 111 of a pixel of a red filter also has a periodic concave-convex structure. The second embodiment is similar to the above-described first embodiment in that the antireflective layer 112 of a pixel of a green filter is a reflective plate including a λ/4 wave plate. Note that, as this periodic concave-convex structure, an inverted pyramid structure can be adopted similarly to that of the above-described first embodiment.

When a periodic concave-convex structure is adopted for the antireflective layer 111 of a pixel of a red filter, this periodic concave-convex structure conspicuously diffracts light in red and infrared wavelengths. Following it, light obliquely propagates in the semiconductor board 100, and an effective optical path extends. As a result, it is possible to achieve high sensitivity to long wavelength as compared with a general solid-state imaging device having the same thickness.

Meanwhile, light having long wavelength such as red rays and infrared rays that have small absorption coefficients is difficult to absorb in the light absorption layer. The diffracted light more easily enters a neighboring pixel. Regarding that point, in an embodiment of the present technology, the trench structure 191 of the element isolation unit 190 is loaded with a metallic material, so that it is possible to shield diffracted light to prevent (or alternatively, reduce) color reproducibility and spatial resolution from degrading.

Disposition of Antireflective Layer

FIG. 13 is a diagram illustrating a disposition example of the color filter 320 and an antireflective layer according to the second embodiment of the present technology. As described above, it is assumed that the color filters 320 are disposed in Bayer arrangement. In addition to a pixel of a blue filter, the antireflective layer of a pixel of a red filter also has a periodic concave-convex structure. The antireflective layer of a pixel of a green filter is a reflective plate including a λ/4 wave plate.

Note that, in this disposition example, a different color is disposed for each pixel. However, as in the second disposition example of the above-described first embodiment, pixels of filters having the same colors may be disposed in units of pixels in Bayer arrangement.

In this way, according to the second embodiment of the present technology, the antireflective layer of a pixel of a red filter also has a periodic concave-convex structure in addition to a pixel of a blue filter, which can reduce reflection in blue and red wavelength regions and improve sensitivity. In this case, irrespective of a higher possibility that diffracted light in a pixel of a red filter enters a neighboring pixel, a metallic material loaded to a trench structure of an element isolation unit shields the diffracted light. Accordingly, it is possible to prevent (or alternatively, reduce) color reproducibility and spatial resolution from degrading.

3. Third Embodiment

In the above-described first and second embodiments, the antireflective layer 112 of a pixel of a green filter is a reflective plate including a λ/4 wave plate. In contrast, if only the light absorption coefficient of silicon is taken into consideration, it is also conceivable to adopt a periodic concave-convex structure for the antireflective layer 112 of a pixel of a green filter. In contrast, a solid-state imaging device today generally includes a phase difference detection pixel for a specific pixel to perform an autofocus function. This phase difference detection pixel is a pixel that makes a focal determination on the basis of the light incidence direction. In general, some of pixels of green filters have that function. However, in the case where pixels of green filters are phase difference detection pixels, crosstalk caused by diffracted light leads to degraded characteristics. Accordingly, it is desirable to refrain from providing any periodic concave-convex structure. In this third embodiment, a structure is then adopted in which no periodic concave-convex structure is provided to a phase difference detection pixel. Note that the overall configuration of the solid-state imaging device is similar to that of the above-described first embodiment, so that detailed description will be omitted.

Structure of Pixel

FIG. 14 is an example of a cross-sectional view of a pixel according to a third embodiment of the present technology. The figure illustrates the cross section over a pixel and a phase difference detection pixel of a blue filter which corresponds to A-B in the plan view of FIG. 4. In addition, similarly to the first embodiment, a solid-state imaging device whose back face is irradiated is used. The upper part of the figure represents the back face of a semiconductor board 100, and the lower part represents the front face of the semiconductor board 100.

In this third embodiment, only the antireflective layer 113 of a pixel of a blue filter has a periodic concave-convex structure. Meanwhile, an antireflective layer 114 of the phase difference detection pixel has no periodic concave-convex structure, but is a reflective plate including a λ/4 wave plate. The other points are similar to those of the above-described first embodiment.

Disposition of Antireflective Layer

FIG. 15 is a diagram illustrating a first disposition example of the color filter 320 and an antireflective layer according to the third embodiment of the present technology. As described above, it is assumed that the color filters 320 are disposed in Bayer arrangement. At the position of a phase difference detection pixel, two adjacent pixels share the on-chip lens 310. The antireflective layer of a pixel of a blue filter then has a periodic concave-convex structure. However, in the case where a phase difference detection pixel is located at a position that is originally for a pixel of a blue filter, there is provided no periodic concave-convex structure, but a reflective plate including a $\lambda/4$ wave plate is used.

FIG. 16 is a diagram illustrating a second disposition example of the color filter 320 and the antireflective layer according to the third embodiment of the present technology. In this second disposition example, in addition to a pixel of a blue filter, the antireflective layer of a pixel of a red filter also has a periodic concave-convex structure. Note that these first and second disposition examples are examples in which a phase difference detection pixel having an on-chip light condensing structure is provided for 2×1 adjacent pixels.

FIG. 17 is a diagram illustrating a third disposition example of the color filter 320 and the antireflective layer according to the third embodiment of the present technology. In this example, a pixel structure is adopted in which the incidence direction is determined as phase difference detection pixels by shielding light for halves of two pixels of green filters in any of 2×2 pixels that serve as a unit for Bayer arrangement. The antireflective layer of a pixel of only a blue filter then has a periodic concave-convex structure. The antireflective layer of a pixel of a filter having a different color which includes a phase difference detection pixel is a reflective plate including a $\lambda/4$ wave plate.

FIG. 18 is a diagram illustrating a fourth disposition example of the color filter 320 and the antireflective layer according to the third embodiment of the present technology. In this fourth disposition example, in addition to a pixel of a blue filter, the antireflective layer of a pixel of a red filter also has a periodic concave-convex structure. Note that these third and fourth disposition examples are examples in which a phase difference detection pixel having an on-chip light condensing structure is provided for 2×2 adjacent pixels.

In this way, in the third embodiment of the present technology, the antireflective layers of pixels of blue filters or pixels of blue and red filters also have periodic concave-convex structures. Meanwhile, in the case of phase difference detection pixels, no periodic concave-convex structure is provided. This can suppress crosstalk caused by diffracted light, and prevent (or alternatively, reduce) the characteristics from degrading.

4. Application Example

The above-described embodiments of the present technology are applicable to various kinds of technology as exemplified below.

Imaging Device

FIG. 19 is a diagram illustrating a configuration example of an imaging device 80 that is an application example of an embodiment of the present technology. This imaging device 80 includes an optical system component unit 81, a driving unit 82, an image sensor 83, and a signal processing unit 84.

The optical system component unit 81 includes an optical lens or the like, and makes an optical image of an object incident on the image sensor 83. The driving unit 82 generates and outputs various timing signals related to the internal driving of the image sensor 83 to control the driving of the image sensor 83. The signal processing unit 84 performs predetermined signal processing on the image signals output from the image sensor 83, and executes the processing corresponding to a result of the signal processing. In addition, the signal processing unit 84 outputs the image signals resulting from the signal processing to the later stage. For example, the signal processing unit 84 records the image signals in a recording medium such as a memory, or transfers the image signals to a predetermined server via a predetermined network.

Here, applying the solid-state imaging device according to the above-described embodiments can improve the sensitivity of the imaging device 80.

Mobile Information Terminal

FIG. 20 is a diagram illustrating an external appearance example of a mobile information terminal 70 that is an application example of an embodiment of the present technology. a of the figure illustrates the front face side of the mobile information terminal 70, and b illustrates the back face side of the mobile information terminal 70.

At the center of the front face of the mobile information terminal 70, a display 71 is disposed to display various kinds of information. In addition, this display 71 also functions as a touch panel, and receives an input from a user.

In the upper part of the front face of the mobile information terminal 70, a front camera 72 is disposed and used chiefly to image a user who uses the mobile information terminal 70. Meanwhile, in the upper part of the rear face of the mobile information terminal 70, a rear camera 73 is disposed and used chiefly to image an object as viewed from a user.

Here, applying the solid-state imaging device according to the above-described embodiments can improve the sensitivity of the front camera 72 and the rear camera 73.

Application

FIG. 21 is a diagram illustrating an example of a field to which an embodiment of the present technology is applied.

The solid-state imaging device according to embodiment of the present technology can be used, for example, as a device that takes images used for viewing, such as a digital camera and a portable appliance with a camera function.

In addition, this solid-state imaging device can be used as a device used for traffic, such as an in-vehicle sensor that takes images of the surroundings of a car, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.

In addition, this solid-state imaging device can be used as a device used for home electrical appliances, such as a TV, a refrigerator, and an air conditioner, to takes images of a gesture of a user and perform appliance operation in accordance with the gesture.

In addition, this solid-state imaging device can be used as a device used for medical care and health care, such as an endoscope and a device that performs angiography by reception of infrared light.

In addition, this solid-state imaging device can be used as a device used for security, such as a monitoring camera for crime prevention and a camera for personal authentication.

In addition, this solid-state imaging device can be used as a device used for beauty care, such as skin measurement equipment that takes images of the skin and a microscope that takes images of the scalp.

In addition, this solid-state imaging can be used as a device used for sports, such as an action camera and a wearable camera for sports and the like.

In addition, this solid-state imaging device can be used as a device used for agriculture, such as a camera for monitoring the condition of the field and crops.

Mobile Object

The technology according to an embodiment of the present disclosure is applicable to a variety of products. For example, the technology according to an embodiment of the present disclosure is implemented as devices mounted on any type of mobile objects such as automobiles, electric vehicles, hybrid electric vehicles, motorcycles, bicycles, personal mobilities, airplanes, drones, ships, and robots.

FIG. 22 is a block diagram illustrating a schematic configuration example of a vehicle control system which is an example of a mobile object control system to which a technology according to an embodiment of the present disclosure is applicable.

A vehicle control system 12000 includes a plurality of electronic control units connected via a communication network 12001. In the example illustrated in the figure, the vehicle control system 12000 includes a drive line control unit 12010, a body system control unit 12020, a vehicle outside information detection unit 12030, a vehicle inside information detecting unit 12040, and an integrated control unit 12050. In addition, as functional configurations of the integrated control unit 12050, a microcomputer 12051, an audio and image output unit 12052, an in-vehicle network interface (I/F) 12053.

The drive line control unit 12010 controls the operation of devices related to the drive line of the vehicle in accordance with a variety of programs. For example, the drive line control unit 12010 functions as a control device for a driving force generating device such as an internal combustion engine or a driving motor that generates the driving force of the vehicle, a driving force transferring mechanism that transfers the driving force to wheels, a steering mechanism that adjusts the steering angle of the vehicle, a braking device that generates the braking force of the vehicle, and the like.

The body system control unit 12020 controls the operations of a variety of devices attached to the vehicle body in accordance with a variety of programs. For example, the body system control unit 12020 functions as a control device for a keyless entry system, a smart key system, a power window device, or a variety of lights such as a headlight, a backup light, a brake light, a blinker, or a fog lamp. In this case, the body system control unit 12020 can receive radio waves transmitted from a portable device that serves instead of the key or signals of a variety of switches. The body system control unit 12020 receives these radio waves or signals, and controls the vehicle door lock device, the power window device, the lights, or the like.

The vehicle outside information detection unit 12030 detects information regarding the outside of a vehicle on which the vehicle control system 12000 is mounted. For example, an imaging unit 12031 is connected to the vehicle outside information detection unit 12030. The vehicle outside information detection unit 12030 causes the imaging unit 12031 to capture an image outside of the vehicle and receives the captured image. The vehicle outside information detection unit 12030 may perform an object detection process or a distance detection process for a person, a vehicle, an obstacle, a sign, letters on a road, or the like on the basis of the received image.

The imaging unit 12031 is a light sensor that receives light and outputs an electric signal in accordance with the amount of received light. The imaging unit 12031 can output the electric signal as an image or distance measurement information. In addition, the light received by the imaging unit 12031 may be the visible light or may be non-visible light such as infrared light.

The vehicle inside information detecting unit 12040 detects information on the inside of the vehicle. The vehicle inside information detecting unit 12040 is connected, for example, to a driver state detecting unit 12041 that detects the state of the driver. The driver state detecting unit 12041 may include, for example, a camera that images the driver. The vehicle inside information detecting unit 12040 may compute the degree of the driver's tiredness or the degree of the driver's concentration or determine whether the driver have a doze, on the basis of detection information input from the driver state detecting unit 12041.

For example, the microcomputer 12051 can calculate a control target value of the driving force generating device, the steering mechanism, or the braking device on the basis of information acquired by the vehicle outside information detecting unit 12030 or the vehicle inside information detecting unit 12040 on the inside and outside of the vehicle, and output a control instruction to the drive line control unit 12010. For example, the microcomputer 12051 may perform cooperative control for the purpose of executing the functions of an advanced driver assistance system (ADAS) including vehicle collision avoidance or impact reduction, follow-up driving based on the inter-vehicle distance, constant vehicle speed driving, vehicle collision warning, vehicle lane departure warning, or the like.

Further, the microcomputer 12051 can control the driving force generating device, the steering mechanism, the braking device, or the like on the basis of information acquired by the vehicle outside information detecting unit 12030 or the vehicle inside information detecting unit 12040 on the areas around the vehicle, thereby performing cooperative control for the purpose of automatic driving or the like that allows the vehicle to autonomously travel irrespective of any operation of a driver.

In addition, the microcomputer 12051 can output a control instruction to the body system control unit 12020 on the basis of the information regarding the outside of the vehicle acquired by the vehicle outside information detection unit 12030. For example, the microcomputer 12051 can control a head lamp in accordance with the position of a preceding vehicle or an oncoming vehicle detected by the vehicle outside information detection unit 12030 and can perform cooperative control for the purpose of anti-glaring such as switching a high beam to a low beam.

The audio and image output unit 12052 transmits an output signal of at least one of a sound and an image to an output device capable of visually or aurally notifying a passenger of the vehicle or the outside of the vehicle of information. In the example of the figure, an audio speaker 12061, a display unit 12062, and an instrument panel 12063 are exemplified as the output device. For example, the display unit 12062 may include at least one of an onboard display and a head-up display.

Figure 23:
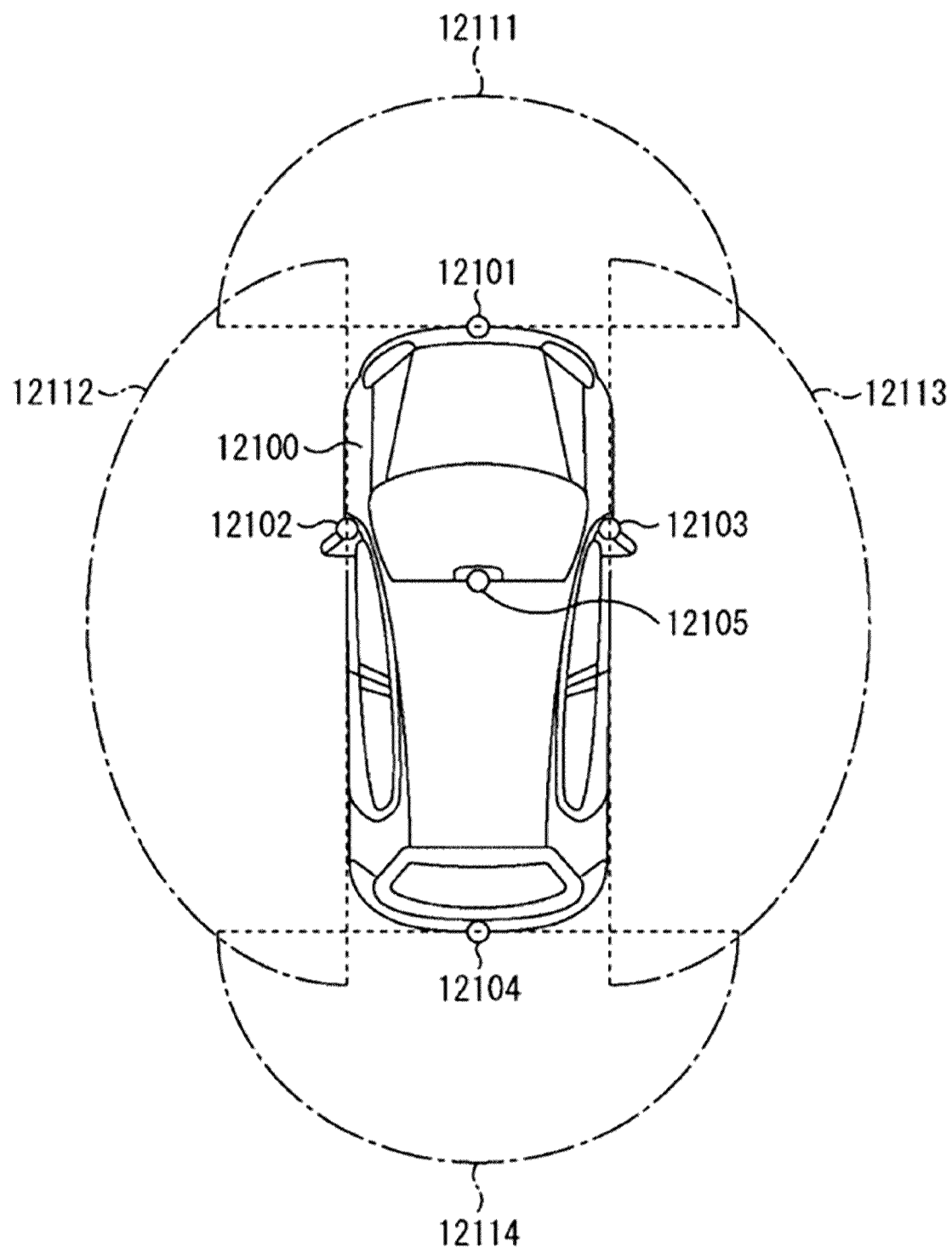
FIG. 23 is a diagram illustrating an example of an installation position of an imaging unit 12031.

FIG. 23 is a diagram illustrating an example of an installation position of the imaging unit 12031.

In the figure, the vehicle 12100 includes imaging units 12101, 12102, 12103, 12104, and 12105 as the imaging unit 12031.

Imaging units 12101, 12102, 12103, 12104, and 12105 are positioned, for example, at the front nose, a side mirror, the rear bumper, the back door, and the upper part of the windshield in the vehicle compartment of a vehicle 12100. The imaging unit 12101 attached to the front nose and the imaging unit 12105 attached to the upper part of the windshield in the vehicle compartment chiefly acquire images of the area ahead of the vehicle 12100. The imaging units 12102 and 12103 attached to the side mirrors chiefly acquire images of the areas on the sides of the vehicle 12100. The imaging unit 12104 attached to the rear bumper or the back door chiefly acquires images of the area behind the vehicle 12100. The images of the area ahead of the vehicle 12100 which are acquired by the imaging units 12101 and 12105 are used chiefly to detect a preceding vehicle, a pedestrian, an obstacle, a traffic light, a traffic sign, a lane, or the like.

Additionally, the figure illustrates an example of the imaging ranges of the imaging units 12101 to 12104. An imaging range 12111 represents the imaging range of the imaging unit 12101 attached to the front nose. Imaging ranges 12112 and 12113 respectively represent the imaging ranges of the imaging units 12102 and 12103 attached to the side mirrors. An imaging range 12114 represents the imaging range of the imaging unit 12104 attached to the rear bumper or the back door. For example, overlaying image data captured by the imaging units 12101 to 12104 offers an overhead image that looks down on the vehicle 12100.

At least one of the imaging units 12101 to 12104 may have a function of acquiring distance information. For example, at least one of the imaging units 12101 to 12104 may be a stereo camera including a plurality of image sensors or may be an image sensor that includes pixels for phase difference detection.

For example, the microcomputer 12051 can extract a 3-dimensional object traveling at a predetermined speed (for example, 0 or more km/h) in substantially the same direction as the vehicle 12100 as a preceding vehicle by particularly using a closest 3-dimensional object on a travel road of the vehicle 12100 by obtaining a distance to each 3-dimensional object within the imaging ranges 12111 to 12114 and a temporal change in the distance (a relative speed to the vehicle 12100) on the basis of distance information obtained from the imaging units 12101 to 12104. Further, the microcomputer 12051 can set an inter-vehicle distance to be ensured in advance before a preceding vehicle and perform automatic brake control (also including follow-up stop control) or automatic acceleration control (also including follow-up oscillation control). In this way, it is possible to perform cooperative control for the purpose of automatic driving or the like that allows the vehicle to autonomously travel irrespective of any operation of a driver.

For example, the microcomputer 12051 can classify and extract 3-dimensional object data regarding 3-dimensional objects as other 3-dimensional objects such as motorcycles, normal vehicles, large vehicles, pedestrians, and electric poles on the basis of the distance information obtained from the imaging units 12101 to 12104 and can use the other 3-dimensional objects to automatically avoid obstacles. For example, the microcomputer 12051 identifies obstacles around the vehicle 12100 as obstacles which can be viewed by a driver of the vehicle 12100 and obstacles which are difficult to view. Then, the microcomputer 12051 can determine a collision risk indicating a danger of collision with each obstacle and output a warning to the driver via the audio speaker 12061 or the display unit 12062 in a situation in which there is a collision possibility since the collision risk is set to be equal to or greater than a set value or can perform driving assistance for collision avoidance by performing forced deceleration or avoidance steering iv via the drive line control unit 12010.

At least one of the imaging units 12101 to 12104 may be an infrared camera that detects infrared light. For example, the microcomputer 12051 can recognize a pedestrian by determining whether there is the pedestrian in captured images of the imaging units 12101 to 12104. The pedestrian can be recognized, for example, in a procedure in which feature points are extracted in the captured images of the imaging units 12101 to 12104 serving as infrared cameras and a procedure in which a series of feature points indicating a contour of an object are subjected to a pattern matching process to determine whether there is the pedestrian. The microcomputer 12051 determines that there is the pedestrian in the captured images of the imaging units 12101 to 12104. When the pedestrian is recognized, the audio and image output unit 12052 controls the display unit 12062 such that a rectangular contour line for emphasis is superimposed to be displayed on the recognized pedestrian. In addition, the audio and image output unit 12052 controls the display unit 12062 such that an icon or the like indicating the pedestrian is displayed at a desired position.

The above describes an example of the vehicle control system to which the technology according to an embodiment of the present disclosure can be applied. The technology according to an embodiment of the present disclosure can be applied to the imaging unit 12031 among the components described above. Specifically, applying the technology according to an embodiment of the present disclosure to the imaging unit 12031 can improve the sensitivity of the imaging unit 12031.

Endoscopic Surgical Operation System

The technology according to the present disclosure can be applied to various products. For example, the technology according to the present disclosure may be applied to an endoscopic surgical system.

Figure 24:
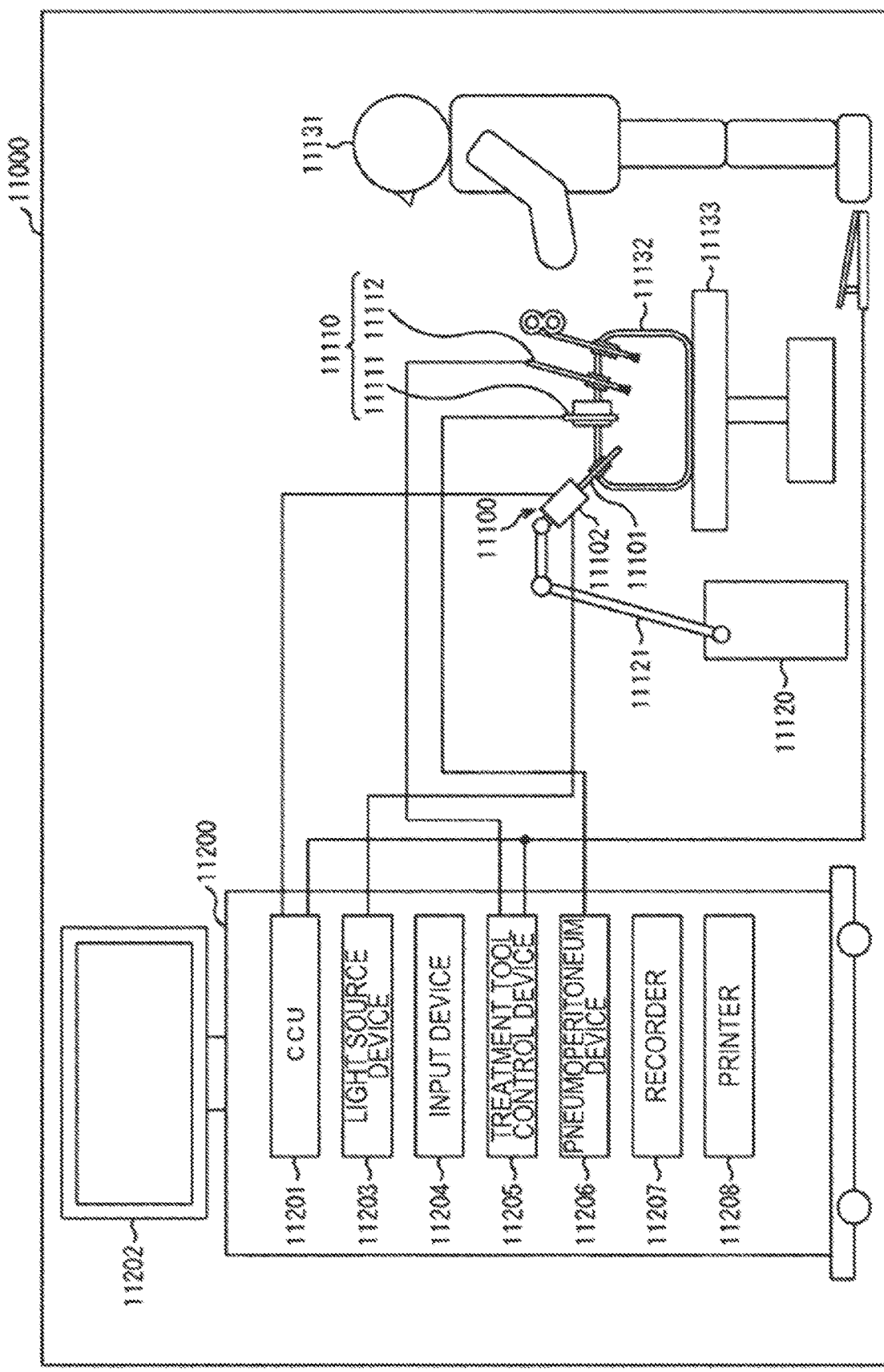
FIG. 24 is a diagram illustrating an example of a schematic configuration of an endoscopic surgical system to which the technology according to an embodiment of the present disclosure can be applied.

FIG. 24 is a diagram showing an example of a schematic configuration of an endoscopic surgical system to which the technology according to the present disclosure can be applied.

The figure shows a state in which an operator (doctor) 11131 performs a surgical operation on a patient 11132 on a patient bed 11133 using an endoscopic surgical system 11000. As shown in FIG. 90, the endoscopic surgical system 11000 includes an endoscope 11100, other surgical tools 11110 such as a pneumoperitoneum tube 11111 and an energy treatment tool 11112, a support arm device 11120 supporting the endoscope 11100, and a cart 11200 in which various devices for performing a surgical operation under an endoscope are mounted.

The endoscope 11100 includes a lens barrel 11101 of which an area of a predetermined length from the tip is inserted into a body cavity of the patient 11132 and a camera head 11102 that is connected to a proximal end of the lens barrel 11101. In the shown example, while the endoscope 11100 configured as a so-called rigid endoscope having the rigid lens barrel 11101 is shown, the endoscope 11100 may be configured as a so-called flexible endoscope having a flexible lens barrel.

At the tip of the lens barrel 11101, an opening into which an objective lens is fitted is provided. A light source device 11203 is connected to the endoscope 11100. Light generated in the light source device 11203 is guided to the tip of the lens barrel by a light guide that extends inside the lens barrel 11101, and is emitted toward an observation target inside the body cavity of the patient 11132 through the objective lens.

Here, the endoscope 11100 may be a direct view mirror or may be a perspective mirror or a side view mirror.

An optical system and an image sensor are provided inside the camera head 11102 and reflected light (observation light) form the observation target is collected in the image sensor by the optical system. The observation light is photoelectrically converted by the image sensor, and an electrical signal corresponding to the observation light, that is, an image signal corresponding to an observation image, is generated. The image signal is transmitted to a camera control unit (CCU) 11201 as RAW data.

The CCU 11201 includes a central processing unit (CPU), a graphics processing unit (GPU), and the like and comprehensively controls operations of the endoscope 11100 and a display device 11202. Further, the CCU 11201 receives the image signal from the camera head 11102, and performs various types of image processing for displaying an image based on the image signal, for example, development processing (demosaic processing) on the image signal.

The display device 11202 displays an image based on the image signal on which image processing is performed by the CCU 11201 under control of the CCU 11201.

The light source device 11203 includes a light source, for example, a light emitting diode (LED), and supplies light to be emitted when an operation part and the like are imaged to the endoscope 11100.

An input device 11204 is an input interface for the endoscopic surgical system 11000. A user can input various types of information and input an instruction to the endoscopic surgical system 11000 through the input device 11204. For example, the user inputs an instruction for changing imaging conditions (such as a type of light emitted, a magnification, and a focal length) of the endoscope 11100.

A treatment tool control device 11205 controls driving of the energy treatment tool 11112 for cauterization and incision of tissue or suturing blood vessels. In order to secure a visual field of the endoscope 11100 and secure a workspace of the operator, a pneumoperitoneum device 11206 injects a gas into the body cavity through the pneumoperitoneum tube 11111 in order to inflate the body cavity of the patient 11132. A recorder 11207 is a device capable of recording various types of information about a surgical operation. A printer 11208 is a device capable of printing various types of information about a surgical operation in various formats such as text, an image or a graph.

Here, the light source device 11203 configured to supply light to be emitted when an operation part is imaged to the endoscope 11100 can include, for example, an LED, a laser light source or a white light source in a combination thereof. When a white light source includes a combination of RGB laser light sources, since it is possible to control output intensities and output timings of the colors (wavelengths) with high accuracy, it is possible to adjust white balance of a captured image in the light source device 11203. In addition, in this case, when laser beams from RGB laser light sources are emitted to the observation target in a time division manner and driving of the image sensor of the camera head 11102 is controlled in synchronization with emission timings thereof, it is possible to capture images corresponding to each of R, G, and B in a time division manner. According to the method, it is possible to obtain a color image without providing a color filter in the image sensor.

In addition, driving of the light source device 11203 may be controlled by changing an intensity of light to be output at predetermined time intervals. Driving of the image sensor of the camera head 11102 is controlled n synchronization with the timing at which the intensity of light is changed, and images are acquired in a time division manner. When the images are combined, it is possible to generate a high dynamic range image without so-called blackout or whiteout.

In addition, the light source device 11203 can supply light of a predetermined wavelength band corresponding to special light observation. In the special light observation, for example, using wavelength dependence of light absorption in body tissue, light of a narrower band than light (that is, white light) emitted during general observation is emitted. Therefore, so-called narrow band light observation (narrow band imaging) in which predetermined tissue such as blood vessels in a mucosal surface layer is imaged with high contrast is performed. Alternatively, in special light observation, fluorescence observation in which an image is obtained by fluorescence generated when excitation light is emitted may be performed. In fluorescence observation, excitation light is emitted toward body tissue and fluorescence from the body tissue is observed (autofluorescence observation), or a reagent such as indocyanine green (ICG) is locally injected into body tissue and excitation light corresponding to a fluorescence wavelength of the reagent is emitted to the body tissue so that a fluorescence image can be obtained. The light source device 11203 can supply narrow band light and/or excitation light corresponding to such special light observation.

FIG. 25 is a block diagram showing an example of functional configurations of the camera head 11102 and the CCU 11201 shown in FIG. 24.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are connected by a transmission cable 11400 so that they can communicate each other.

The lens unit 11401 is an optical system that is provided at a connection part with the lens barrel 11101. Observation light received from the tip of the lens barrel 11101 is guided to the camera head 11102 and is incident on the lens unit 11401. The lens unit 11401 includes a combination of a plurality of lenses including a zoom lens and a focus lens.

The imaging unit 11402 includes an image sensor. The imaging unit 11402 may include one image sensor (so-called single plate type) or may include a plurality of image sensors (so-called multi-plate type). When the imaging unit 11402 is a multiplate type, for example, image signals corresponding to R, G, and B are generated by the image sensors, and these may be combined to obtain a color image. Alternatively, the imaging unit 11402 may include a pair of image sensors in order to acquire image signals for the right eye and left eye corresponding to a 3D (dimensional) display. When the 3D display is provided, the operator 11131 can recognize a depth of biological tissue in the operation part more accurately. Here, when the imaging unit 11402 is a multi-plate type, a plurality of lens units 11401 are provided to correspond to image sensors.

In addition, the imaging unit 11402 may not be necessarily provided in the camera head 11102. For example, the imaging unit 11402 may be provided inside the lens barrel 11101 and immediately behind the objective lens.

The drive unit 11403 includes an actuator and moves a zoom lens and a focus lens of the lens unit 11401 by a predetermined distance along the optical axis under control of the camera head control unit 11405. Accordingly, a magnification and a focus of a captured image by the imaging unit 11402 can be appropriately adjusted.

The communication unit 11404 includes a communication device configured to transmit and receive various types of information to and from the CCU 11201. The communication unit 11404 transmits an image signal obtained from the imaging unit 11402 to the CCU 11201 through the transmission cable 11400 as RAW data.

In addition, the communication unit 11404 receives a control signal for controlling driving of the camera head 11102 from the CCU 11201 and supplies the received signal to the camera head control unit 11405. The control signal includes information about imaging conditions, for example, information for designating a frame rate of a captured image, information for designating an exposure value during imaging, and/or information for designating a magnification and a focus of a captured image.

Here, imaging conditions such as the frame rate, the exposure value, the magnification, and the focus may be appropriately designated by the user, or may be automatically set by the control unit 11413 of the CCU 11201 on the basis of the acquired image signal. In the latter case, a so-called auto exposure (AE) function, auto focus (AF) function and auto white balance (AWB) function are provided for the endoscope 11100.

The camera head control unit 11405 controls driving of the camera head 11102 on the basis of the control signal received from the CCU 11201 through the communication unit 11404.

The communication unit 11411 includes a communication device configured to transmit and receive various types of information to and from the camera head 11102. The communication unit 11411 receives an image signal transmitted through the transmission cable 11400 from the camera head 11102.

In addition, the communication unit 11411 transmits a control signal for controlling driving of the camera head 11102 to the camera head 11102. The image signal and the control signal can be transmitted through telecommunication, optical communication, or the like.

The image processing unit 11412 performs various types of image processing on the image signal which is RAW data transmitted from the camera head 11102.

The control unit 11413 performs various types of control regarding imaging of an operation part by the endoscope 11100 or the like, and displaying of a captured image obtained by imaging the operation part or the like. For example, the control unit 11413 generates a control signal for controlling driving of the camera head 11102.

In addition, the control unit 11413 displays a captured image showing an operation part and the like on the display device 11202 on the basis of the image signal on which image processing is performed by the image processing unit 11412. In this case, the control unit 11413 may recognize various objects in the captured image using various image recognition technologies. For example, when the shape of an edge, a color, and the like of the object included in the captured image are detected, the control unit 11413 can recognize a surgical tool such as a forceps, a specific body part, bleeding, mist generated when the energy treatment tool 11112 is used. When the captured image is displayed on the display device 11202, the control unit 11413 may display various types of operation support information on the image of the operation part in an overlapping manner using the recognition result. When the operation support information is displayed in an overlapping manner and is presented to the operator 11131, it is possible to reduce a burden on the operator 11131 and the operator 11131 can reliably proceed a surgical operation.

The transmission cable 11400 connecting the camera head 11102 and the CCU 11201 is an electrical signal cable supporting electrical signal communication, an optical fiber supporting optical communication, or a composite cable thereof.

Here, while wired communication is performed using the transmission cable 11400 in the shown example, wireless communication may be performed between the camera head 11102 and the CCU 11201.

An example of the endoscopic surgical system to which the technology according to the present disclosure can be applied has been described above. The technology according to an embodiment of the present disclosure can be applied to the endoscope 11100 and the imaging unit 11402 of the camera head 11102 among the components described above. Specifically, applying the technology according to an embodiment of the present disclosure to the endoscope 11100 and the imaging unit 11402 of the camera head 11102 can improve the sensitivity of the endoscope 11100 and the imaging unit 11402 of the camera head 11102.

Here, while the endoscopic surgical system has been described as an example, the technology according to the present disclosure may be applied to other systems, for example, a microscopic surgical system.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

Note that the effects described in the present specification are not limiting but are merely examples, and there may be other effects.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

(1)

A solid-state imaging device including:

a color filter that is provided for each of pixels which are two-dimensionally disposed, and supports any of at least three different types of wavelength bands; and an antireflective layer that is provided on a light-receiving surface of the pixel which receives light coming via the color filter, and further has a periodic concave-convex structure for some of the at least three types.

(2)

The solid-state imaging device according to (1), in which the color filter supports, as the at least three different types of wavelength bands, any three types of infrared, red, green, blue, ultraviolet, and achromatic wavelength bands.

(3)

The solid-state imaging device according to any of (1) to (2), in which the color filter is disposed in accordance with Bayer arrangement, and the antireflective layer has a planar film structure for a pixel in which the color filter is a green filter, and has the periodic concave-convex structure for a pixel in which the color filter is a blue filter.

(4)

The solid-state imaging device according to any of (1) to (3), in which the antireflective layer also has the periodic concave-convex structure for a pixel in which the color filter is a red filter.

(5)

The solid-state imaging device according to any of (1) to (4), in which the periodic concave-convex structure is a structure in which inverted pyramid structures each having a crystal plane (111) of silicon are periodically disposed.

(6)

The solid-state imaging device according to any of (1) to (5), in which an angle of the inverted pyramid structure with a silicon board face is a value $\arctan(2^{1/2})$ of an arctangent function.

(7)

The solid-state imaging device according to any of (1) to (6), in which distance between adjacent pyramids in the inverted pyramid structure is from 200 nm to 800 nm.

(8)

The solid-state imaging device according to any of (1) to (7), in which length of one side of each of the inverted pyramid structures is from 200 nm to 800 nm.

(9)

The solid-state imaging device according to any of (1) to (8), in which a number of pyramids in the inverted pyramid structure is an integer number for each of the pixels.

(10)

The solid-state imaging device according to any of (1) to (9), in which the antireflective layer includes a reflective plate including a $\lambda/4$ wave plate for a pixel in which the color filter is a green filter, and has the structure in which the inverted pyramid structures are periodically disposed for a pixel in which the color filter is an ultraviolet or blue filter.

(11)

The solid-state imaging device according to any of (1) to (10), in which the antireflective layer also has the structure in which the inverted pyramid structures are periodically disposed for a pixel in which the color filter is a red filter.

(12)

The solid-state imaging device according to any of (1) to (11), further including:

a photoelectric conversion unit that converts light received for each of the pixels into a voltage signal; and an element isolation unit that isolates the photoelectric conversion units for each of the pixels, in which the element isolation unit has a structure in which a trench structure is embedded into a silicon board.

(13)

The solid-state imaging device according to any of (1) to (12), in which the element isolation unit is obtained by loading the trench structure with a metallic material.

(14)

The solid-state imaging device according to any of (1) to (13), in which the metallic material includes tungsten, aluminum, copper, or a metallic alloy thereof as a chief component.

(15)

The solid-state imaging device according to any of (1) to (14), further including:

a phase difference detection pixel that has one on-chip light condensing structure in 2×1 adjacent pixels or 2×2 adjacent pixels, in which the antireflective layer has a planar film structure for the phase difference detection pixel.

(16)

An electronic apparatus including:

a color filter that is provided for each of pixels which are two-dimensionally disposed, and supports any of at least three different types of wavelength bands;

an antireflective layer that is provided on a light-receiving surface of the pixel which receives light coming via the color filter, and further has a periodic concave-convex structure for some of the at least three types;

a photoelectric conversion unit that converts the light received for each of the pixels into a voltage signal; and a signal processing unit that performs predetermined signal processing on the voltage signal.

(17)

An imaging device, comprising:

a first photoelectric conversion region receiving light within a first range of wavelengths;

a second photoelectric conversion region receiving light within a second range of wavelengths; and a third photoelectric conversion region receiving light within a third range of wavelengths, wherein at least a portion of a light-receiving surface of the first photoelectric conversion region has a first concave-convex structure, and wherein a light-receiving surface of the second photoelectric conversion region has a different structure than the first concave-convex structure.

(18)

The imaging device according to (17) wherein the different structure of the light-receiving surface of the second photoelectric conversion region is planar, and wherein a light-receiving surface of the third photoelectric conversion region is planar.

(19)

The imaging device according to any of (17) to (18), wherein at least a portion of a light-receiving surface of the third photoelectric conversion region has a second concave-convex structure.

(20)

The imaging device according to any of (17) to (19), wherein the first range of wavelengths corresponds to blue light.

(21)

The imaging device according to any of (17) to (20), wherein the second range of wavelengths corresponds to green light.

(22)

The imaging device according to any of (17) to (21), wherein the third range of wavelengths corresponds to red light.

(23)

The imaging device according to any of (17) to (22), further comprising:

a first color filter that passes light corresponding to the first range of wavelengths and that overlaps the first photoelectric conversion region;

a second color filter that passes light corresponding to the second range of wavelengths and that overlaps the second photoelectric conversion region; and a third color filter that passes light corresponding to the third range of wavelengths and that overlaps the third photoelectric conversion region.

(24)

The imaging device according to any of (17) to (23), further comprising:

a first anti-reflective layer disposed on the light-receiving surface of the first photoelectric conversion region, the first anti-reflective layer having the first concave-convex structure.

(25)

The imaging device according to any of (17) to (24), further comprising:

a second anti-reflective layer disposed on the light-receiving surface of the second photoelectric conversion region, the second anti-reflective layer having the different structure.

(26)

The imaging device according to any of (17) to (25), wherein a thickness of the second anti-reflective layer is one-quarter of a selected one of the wavelengths within the second range of wavelengths, and wherein the different structure is a planar structure.

(27)

The imaging device according to any of (17) to (26), further comprising:

a third anti-reflective layer disposed on a light receiving surface of the third photoelectric conversion element.

(28)

The imaging device according to any of (17) to (27), wherein a thickness of the third anti-reflective layer is one-quarter of a selected one of the wavelengths within the third range of wavelengths, and wherein the third anti-reflective layer is planar.

(29)

The imaging device according to any of (17) to (28), wherein the portion of the light-receiving surface of the first photoelectric conversion element having the first concave-convex structure comprises silicon.

(30)

The imaging device according to any of to (17) to (29), wherein the first concave-convex structure is one of a pyramid structure or an inverted pyramid structure.

(31)

The imaging device according to any of (17) to (30), wherein an angle formed by sides of the pyramid structure with respect to a surface of the silicon is about 55 degrees.

(32)

The imaging device according to any of (17) to (31), wherein the surface of the silicon is a (100) surface and the sides of the pyramid structure are (111) surfaces.

(33)

The imaging device according to any of (17) to (32), wherein at least a portion of a light-receiving surface of the third photoelectric conversion region has a second concave-convex structure.

(34)

The imaging device according to any of (17) to (33), wherein the first range of wavelengths corresponds to blue light and the third range of wavelengths corresponds to red light.

(35)

The imaging device according to any of (17) to (34), wherein the first and second concave-convex structures are periodic.

(36)

An electronic device, comprising:

a signal processor; and an imaging device including:

a first photoelectric conversion region receiving light within a first range of wavelengths;

a second photoelectric conversion region receiving light within a second range of wavelengths; and a third photoelectric conversion region receiving light within a third range of wavelengths, wherein at least a portion of a light-receiving surface of the first photoelectric conversion region has a concave-convex structure, and wherein a light-receiving surface of the second photoelectric conversion region has a different structure than the concave-convex structure.

REFERENCE SIGNS LIST 10 pixel region
11 pixel
12 transfer transistor
13 floating diffusion region
14 reset transistor
15 amplifier transistor
16 selection transistor
17 photo diode
20 vertical drive circuit
30 horizontal drive circuit
40 control circuit
50 column signal processing circuit
60 output circuit
100 semiconductor board
111 to 114 antireflective layer
120 transfer gate
130 floating diffusion region
140 reset transistor
150 amplifier transistor
170 photo diode
190 element isolation unit
191 trench structure
200 wiring layer
220 wire
310 on-chip lens
320 color filter
330 planarization film
340 light-shielding film
11100 endoscope
11102 camera head
11402, 12031 imaging unit

What is claimed is:

1. A light detecting device, comprising:
a first unit of pixels including first photoelectric conversion regions in a semiconductor substrate and a first color filter, wherein the first color filter is configured to transmit light in a first wavelength range;
a second unit of pixels including second photoelectric conversion regions in the semiconductor substrate and a second color filter, wherein the second color filter is configured to transmit light in a second wavelength range; and
a third unit of pixels including third photoelectric conversion regions in the semiconductor substrate and a third color filter, wherein the third color filter is configured to transmit light in a third wavelength range,
wherein the first unit of pixels is adjacent to the second unit of pixels and the third unit of pixels, wherein an antireflective layer of the second unit of pixels is a single-layer film having a thickness corresponding to a quarter of the second wavelength range with a planar structure in a cross-sectional view, wherein an antireflective layer of the third unit of pixels has a concave structure in the cross-sectional view, and wherein the antireflective layers of the second unit of pixels and the third unit of pixels are disposed between a respective color filter and a respective photoelectric conversion region.

2. The light detecting device according to claim 1, wherein the first wavelength range corresponds to green light, wherein the second wavelength range corresponds to red light, and wherein the third wavelength range corresponds to blue light.

3. The light detecting device according to claim 1, wherein the first unit of pixels, the second unit of pixels, and the third unit of pixels are separated by an element isolation unit.

4. The light detecting device according to claim 3, wherein the planar structure is disposed between a first portion of the element isolation unit and a second portion of the element isolation unit in the cross-sectional view.

5. The light detecting device according to claim 3, wherein the element isolation unit comprises a trench structure.

6. The light detecting device according to claim 2, wherein a light receiving surface of the semiconductor substrate of the first unit of pixels includes the planar structure in the cross-sectional view.

7. An electronic device, comprising:
a signal processor; and
a light detecting device including:
a first unit of pixels including first photoelectric conversion regions in a semiconductor substrate and a first color filter, wherein the first color filter is configured to transmit light in a first wavelength range;
a second unit of pixels including second photoelectric conversion regions in the semiconductor substrate and a second color filter, wherein the second color filter is configured to transmit light in a second wavelength range; and
a third unit of pixels including third photoelectric conversion regions in the semiconductor substrate and a third color filter, wherein the third color filter is configured to transmit light in a third wavelength range,
wherein the first unit of pixels is adjacent to the second unit of pixels and the third unit of pixels,
wherein an antireflective layer of the second unit of pixels is a single-layer film having a thickness corresponding to a quarter of the second wavelength range with a planar structure in a cross-sectional view,
wherein an antireflective layer of the third unit of pixels has a concave structure in the cross-sectional view, and
wherein the antireflective layers of the second unit of pixels and the third unit of pixels are disposed between a respective color filter and a respective photoelectric conversion region.

8. A light detecting device, comprising:
a first unit of pixels including first photoelectric conversion regions in a semiconductor substrate and a first color filter, wherein the first color filter is configured to transmit light in a first wavelength range;
a second unit of pixels including second photoelectric conversion regions in the semiconductor substrate and a second color filter, wherein the second color filter is configured to transmit light in a second wavelength range; and
a third unit of pixels including third photoelectric conversion regions in the semiconductor substrate and a third color filter, wherein the third color filter is configured to transmit light in a third wavelength range,
wherein the first unit of pixels is adjacent to the second unit of pixels and the third unit of pixels in a plan view,
wherein an antireflective layer of the second unit of pixels is a single-layer film having a thickness corresponding to a quarter of the second wavelength range that does not include a concave structure in a cross-sectional view,
wherein an antireflective layer of the third unit of pixels has the concave structure in the cross-sectional view, and
wherein the antireflective layers of the second unit of pixels and the third unit of pixels are disposed between a respective color filter and a respective photoelectric conversion region.

9. The light detecting device according to claim 8, wherein the first wavelength range corresponds to green light, wherein the second wavelength range corresponds to red light, and wherein the third wavelength range corresponds to blue light.

10. The light detecting device according to claim 9, wherein the first unit of pixels, the second unit of pixels, and the third unit of pixels are separated by an element isolation unit.

11. The light detecting device according to claim 10, wherein the element isolation unit comprises a trench structure.

12. The light detecting device according to claim 8, wherein a light receiving surface of the semiconductor substrate of the first unit of pixels does not include the concave structure in the cross-sectional view.

13. The light detecting device according to claim 1, further comprising:
a fourth unit of pixels including fourth photoelectric conversion regions in the semiconductor substrate and a fourth color filter, wherein the fourth color filter is configured to transmit light in the second wavelength range.

14. The light detecting device according to claim 13, wherein an antireflective layer of the fourth unit of pixels includes a planar structure in the cross-sectional view.

15. The electronic device according to claim 7, further comprising:
a fourth unit of pixels including fourth photoelectric conversion regions in the semiconductor substrate and a fourth color filter, wherein the fourth color filter is configured to transmit light in the second wavelength range, and wherein an antireflective layer of the fourth unit of pixels includes the planar structure in the cross-sectional view.

16. The light detecting device according to claim 8, further comprising:
a fourth unit of pixels including fourth photoelectric conversion regions in the semiconductor substrate and a fourth color filter, wherein the fourth color filter is configured to transmit light in the second wavelength range, and wherein an antireflective layer of the fourth unit of pixels does not include the concave structure in the cross-sectional view.

\* \* \* \* \*